United States Patent [19]

Rudy

[11] Patent Number: 4,862,347
[45] Date of Patent: Aug. 29, 1989

[54] SYSTEM FOR SIMULATING MEMORY ARRAYS IN A LOGIC SIMULATION MACHINE

[75] Inventor: Ann M. Rudy, San Jose, Calif.

[73] Assignee: International Business Machine Corporation, Armonk, N.Y.

[21] Appl. No.: 855,013

[22] Filed: Apr. 22, 1986

[51] Int. Cl.[4] .................... G06F 15/16; G06F 9/44; G06F 9/38; G06F 13/12
[52] U.S. Cl. ......................... 364/200; 364/232.3; 364/243; 364/244.8
[58] Field of Search ... 364/200 MS File, 900 MS File, 364/488, 489, 490, 578; 371/23

[56] References Cited

U.S. PATENT DOCUMENTS

| | | | |
|---|---|---|---|
| 4,253,145 | 2/1981 | Goldberg | 364/200 |
| 4,306,286 | 12/1981 | Cocke et al. | 364/200 |
| 4,456,954 | 6/1984 | Bullions, III et al. | 364/200 |
| 4,488,354 | 12/1984 | Chan et al. | 364/490 |
| 4,584,642 | 4/1986 | Fudanuki | 364/200 |
| 4,587,625 | 5/1986 | Marino, Jr. et al. | 364/900 |
| 4,621,339 | 11/1986 | Wagner et al. | 364/900 |
| 4,656,580 | 4/1987 | Hitchcock, Sr. et al. | 364/200 |
| 4,725,971 | 2/1988 | Doshi et al. | 364/200 |
| 4,725,975 | 2/1988 | Sasaki | 364/900 |
| 4,736,338 | 4/1988 | Saxe et al. | 364/900 |

OTHER PUBLICATIONS

Proceedings of the 1983 IEEE International Conference on Computer Design, Oct. 1983, Article Entitled: "The IBM Los Gatos Simulation Machine Hardware" at p. 3, Ted Burggraff, Al Love, Richard Malm, Ann Rudy.
Proceedings of the 1983 IEEE International Conference on Computer Design, Oct. 1983, Article Entitled: "Using the IBM Los Gatos Logic Simulation Machine" at p. 2, John K. Howard, Jack Kohn, Richard Malm, Ann Rudy.
Proceedings of the 1983 IEEE International Conference on Computer Design, Oct. 1983, Article Entitled: "Introduction to the IBM Los Gatos Logic Simulation Machine", John K. Howard, Richard L. Malm, Larry M. Warren, pp. 1-4.
Proceedings of the 1983 IEEE International Conference on Computer Design, Oct. 1983, Article Entitled: "The IBM Los Gatos Logic Simulation Machine Software", Jack Kohn, Richard Malm, Chuck Meiley, Frank Nemec, pp. 1-4.
"IBM's Engineering Design System Support for VLSI Design and Verification": Larry N. Dunn, IEEE Design and Test, Feb. 1984, pp. 30-40.
"Parallel Processing Interactively Simulates Complex VSLI Logic" at pp. 149-150, John K. Howard, Richard L. Malm, Larry M. Warren, Electronics, Dec. 1983.

Primary Examiner—Archie E. Williams, Jr.
Assistant Examiner—Florin Muntean-R
Attorney, Agent, or Firm—Baker, Maxham, Jester & Meador

[57] ABSTRACT

A method and apparatus for simulating memory devices in a logic simulation machine include a finite state machine (FSM) having input/output (I/O) sources, instruction storage resources, a real memory resource, and instruction execution resources. A plurality of memory device ports to be simulated are defined and associated with corresponding respective subsets of the I/O resources of the FSM. Permutated sets of simulated memory array access signals, such as data, address, and control, are bound to selectable ones of the simulated memory ports and stored in the FSM, with the parameters of the memory operation established by the simulated signals. Stored sets of access instructions, representative of memory access operations, are augmented by the simulated signals and executed by the FSM against the real memory resource. All array instructions representing the same memory array share the same address space in the real memory resource.

10 Claims, 16 Drawing Sheets

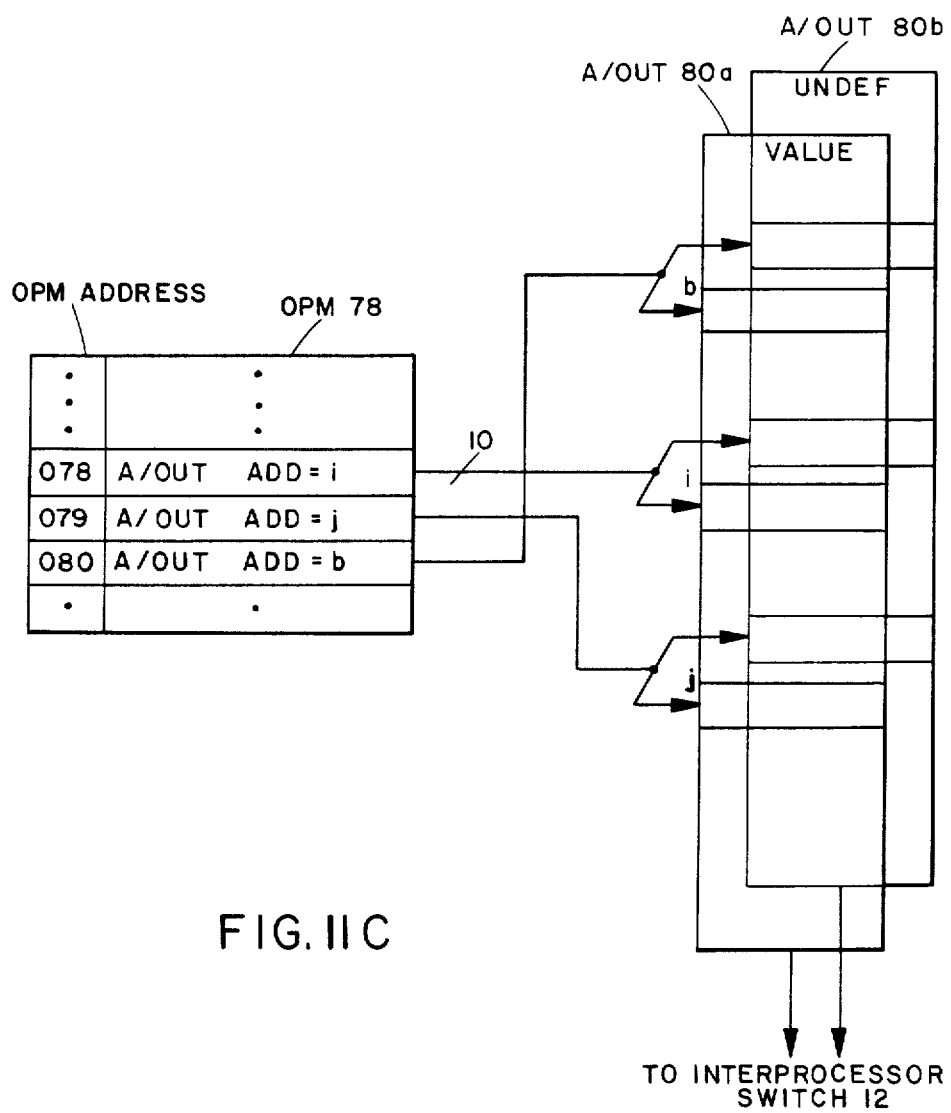
FIG. IIC

SYSTEM FOR SIMULATING MEMORY ARRAYS IN A LOGIC SIMULATION MACHINE

BACKGROUND OF THE INVENTION

This invention is concerned with the simulation of multi-port memory array operation by means of a special purpose processor utilizing simulated access signals provided by a logic simulation machine which produces signals representative of the operation of logic surrounding the simulated memory arrays.

Simulation is extensively used in the design of electronic logic circuits. Once a logic circuit's design has been reduced, its operation can be examined indirectly by means of a logic simulation machine (LSM) that operates to represent the operation of the circuit under a set of specified test conditions. The purpose of the machine simulation is to detect design errors in a simulated logic and enable the logic designer to correct the errors before manufacture of the design.

A particular logic simulation machine is described in a series of articles found in the Proceedings of the 1983 IEEE International Conference on Computer Design. The articles are: "Introduction to the IBM Los Gatos Logic Simulation Machine," John K. Howard et al, "The IBM Los Gatos Simulation Machine Hardware," Ted Burggraff et al, "The IBM Los Gatos Logic Simulation Machine Software," Jack Kohn et al, and "Using the IBM Los Gatos Logic Simulation Machine," John K. Howard et al. The LSM described in those articles was first disclosed in U.S. Pat. No. 4,306,286 of Cocke et al, which is incorporated herein by reference.

The LSM of U.S. Pat. No. 4,360,286 is a highly parallel machine that incorporates a plurality of functionally equivalent processors, each able to simulate a portion of a logic network. The operations of the parallel processors are orchestrated and integrated by means of a control unit including an interactive processor switch that provides connectivity between the processors and a control processor that exercises overall control of the machine and provides input/output and programming capability. The operation of the prior art LSM is based upon the execution in each of the parallel processors of a series of instructions, with each instruction initiating a machine operation step that corresponds to the operation of a single logic gate. The machine operates cyclically, with each basic cycle corresponding to a single updating of all signal values in a simulated logic gate.

While extremely efficient in simulating logic circuits made up of discrete gates, the prior art LSM only awkwardly simulates memory arrays for the reason that the machine simulation operates on the individual bits involved in logic gate operation Therefore, for the prior art LSM to simulate, for example, operation on each bit of an 8×32K memory array, over 256,000 individual instructions would be required. Clearly, the prior art logic simulator awaits an advance whereby multi-bit memory operation can be simulated by a minimal set of instructions. Preferably, each simulated memory reference would be implemented by a single instruction.

SUMMARY OF THE INVENTION

The advance awaited by the prior LSM is realized in the invention by defining a memory array access instruction ("array instruction") that implements simulation of a memory reference operation and permitting it to operate on a plurality of simulated memory access signals. Each array instruction operates on its associated plurality of signals in a single instruction execution step to simulate a predefined memory reference at a particular port of a simulated memory array, with the memory reference parameters set by the simulated signals. In this context, the phrase "memory reference" denotes a memory read or write operation, while the term "memory reference parameter" references to the specific set of data, address, and memory control conditions under which the simulated memory reference is made.

The method of the invention simulates memory references made on a machine-accessible memory array by execution upon a logic simulation machine in which an interfacing finite state machine (FSM) simulates at least one memory array. The steps of the simulation method include defining one or more memory port names to, represent o a simulated memory array and associating the memory port names with corresponding respective subsets of the input/output (I/O) resources of the FSM. Memory array instructions defining simulated memory references are bound to the defined port names and stored in the FSM. Simulated memory access signals from the LSM are permutatively entered into the respective I/O resource subsets according to a pattern that associates the signals with particular ones of the memory access instructions. Finally, the instruction sets are executed on the FSM to simulate access to the memory array, using the associated memory access signals to establish the memory reference parameters of respective simulated operations.

The finite state machine of the invention is a pipeline processor intended to simulate operations on machine-accessible multi-port memory arrays in response to simulated memory access signals provided by a logic simulation machine. The processor includes a first permutating input/output (I/O) facility that receives simulated memory access signals during one machine operation cycle while providing permuted simulated memory access signals received during a previous machine operation cycle. A programmable input permutation memory arranges the storage of received simulated memory access signals in respective subsets of the first permutating I/O facility in response to a predetermined programed permutation pattern. A programmable simulation profile memory receives and stores array instructions defining a plurality of memory port names that are associated with corresponding respective subsets of the first or a second permutating I/O storage facility. The array instructions further define simulated memory references to be performed on simulated memory arrays that are defined by the port names. A programmable output permutation memory extracts memory port output signals stored in the second permutative I/O facility in response to a predetermined programed permutation pattern. The processor also includes an array instruction execution circuit that receives the permutatively stored memory access signals from the first I/O resource and array instructions from the memory simulation profile memory; executes the received array instructions to simulate the performance of memory references on defined memory port names according to memory access parameters established by the received permutated memory access signals; and provides the simulated memory output signals.

Therefore, the primary objective of the present invention is to provide a method and means that simulate, by means of a single instruction, a memory reference involving a plurality of simulated memory access parameter signals.

This important objective and other objects and advantages of the present invention will become evident when the following detailed description is read in connection with the below-described drawings.

BRIEF DESCRIPTION OF THE DRAWINGS

FIGS. 11A–11C illustrate partitioning, reading from, and writing to the AOUT/BOUT memory of FIG. 5B.

DETAILED DESCRIPTION OF THE PREFERRED EMBODIMENT

Figure 1:
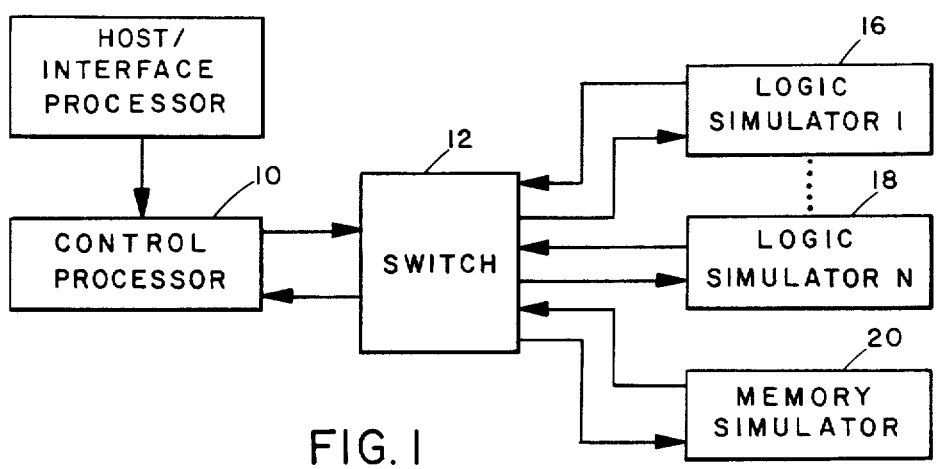
FIG. 1 is a block diagram illustrating a representative operational system environment of the invention.

Logic simulation machines employing parallel processing technology to simulate the operation of logic circuits under design are known in the art. In this regard, reference is made to the four articles cited above. FIG. 1 illustrates a block diagram of the LSM system described in the articles.

The LSM includes a control processor and a plurality of logic simulators. The control processor controls, schedules and synchronizes the various operations undertaken by the system in simulating the operation of a particular logic design. In addition, the control processor interfaces between the simulation system and a host-/interface processor through which descriptions of logic designs and test patterns are entered in a high level programming language. The prior LSM host/interface processor includes a compiler that translates the high level design descriptions into a specific machine-understandable simulation program. As presented in the article cited above that is entitled "The IBM Los Gatos Logic Simulation Machine Software", the prior art compiler includes the ability to interpret high level commands, assemble a list of instructions to implement the commands, and schedule allocation of the resources available on the LSM.

The resources of the LSM, in addition to a control processor 10, include an inter-processor switch 12 and logic simulator processors 16, 18. The inter-processor switch 12 is an NXN crossbar that enables any one of the logic simulator processors to communicate with any other processor in the LSM.

The logic simulator processors 16, 18 are well understood and reference is made once again to the U.S. Pat. No. 4,306,286 of Cocke et al. As described in the Cocke patent, the logic simulator processors 16, 18 operate in parallel to simulate particular portions of a simulated logic design and exchange simulated data signals through the inter-processor switch 12.

To initiate a logic design simulation, the assembled instructions are passed through the control processor 10, via the inter-processor switch 12 into instruction and data memories in specific ones of the processors 16, 18. As is known, the compiler possesses the ability not only to distribute instructions to the processors 16, 18, but also the ability to order those instructions within each processor and to schedule the inter-processor communications necessary to the simulation.

The basic LSM signal unit has four possible states which are encoded in two bits; a value bit and an undefined bit. The states are: uninitialized, undefined, logical 0, and logical 1. The uninitialized state represents a signal state not initialized prior to simulation, or not yet computed, once simulation has begun. The other three states are the result of initialization prior to simulation or the result of instruction execution during simulation. In the discussion following, when the basic signalling unit is referred to as a bit, it is to be understood that, in the posited operational environment, the bit includes the value and undefined bits of the Cocke LSM. However, it must be appreciated that, in other contexts, the below-described invention can be adapted to other basic simulation signal units.

The invention resides in a memory simulator 20 that is connected to a logic simulation machine such as the prior art LSM of U.S. Pat. No. 4,306,286. The memory simulator 20 invests the LSM with the capability of simulating multi-port memory arrays based on the particular structure and function of a programming and hardware construct. The benefit conferred on the prior art LSM by the invention can be appreciated when a typical logic design including an internal memory is simulated on a prior art LSM not including a memory simulator 20: such a simulation is done at the cost of one LSM instruction per memory storage space. For example, in a logic design including a 32×32 bit memory, the prior art system would require 1024 LSM instructions to operate on all of the memory bits, which would consume the total operational capacity of one of the logic simulator processors 16, 18. Contrastingly, the memory simulator 20 can simulate the operation of the same memory by the use of a single instruction per memory port (that is, per Read or Write port).

Figure 2:
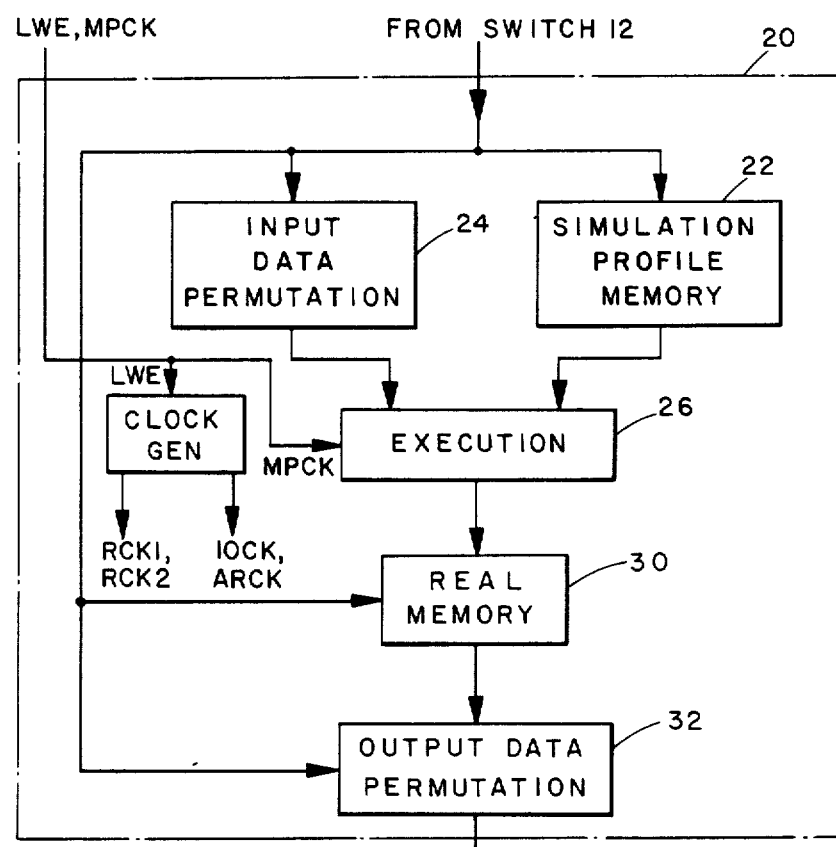
FIG. 2 is a schematic block diagram illustrating the primary functional zones of the invention.

FIG. 2 illustrates the basic architecture of the memory array simulator 20. The memory array simulator 20 includes a simulation profile memory 22, an input data permutation circuit 24, array instruction execution 26, a real memory resource 30, and an output data permutation circuit 32. Also included in the simulator 20 is a conventional clock generation circuit (CLOCK GEN) 33 that produces a number of clocks for synchronizing simulator operations with the LSM A memory in a simulated logic design is represented by a series of memory array instructions entered into the simulation profile memory 22. Each simulated memory is represented by as many memory array instructions as are needed to represent the read or write ports of that memory. In the preferred embodiment, each memory array instruction models only a uniquely-named Read or Write port.

Data signals, representing memory access parameters such as data to be written in the simulated memory, address data, identifying the memory sector to be operated on, and control data indicating port or device selection, are received from logic simulator processors and passed through the input data permutation circuit 24. The input data permutation circuit rearranges the simulated memory access parameter signals in such a manner as to associate respective signals with particular array instructions in the profile memory 22. As described below, the input data permutation circuit 24 permutes the simulated signals according to a permutation pattern that is entered into the circuit 24 at the time that the access instructions are entered into the memory 22. During operation of the memory simulator 20, simulated signals are combined with respective associated instructions in the instruction execution assembly 26. The combined data assembled in the information execution assembly include all of the simulated data, address and control information necessary to enable the assembly to perform the simulated memory access operation against the real memory 30.

Simulated read operations cause data to be extracted from the real memory 30 and passed through the output data permutation circuit 32 to various locations in the LSM. The, output data permutation circuit also has embedded a permutation pattern that schedules the forwarding of the simulated read data to the LSM.

During an initial program load (IPL) mode of operation, memory array instructions are entered into the simulation profile memory 22 and respective permutation patterns are lodged in the permutation circuits 24 and 32. During the simulation (RUN) mode of operation, simulated memory access signals are received from and forwarded to the LSM through the input and output data permutation circuits respectively. As illustrated, all communications with LSM in the IPL and RUN modes are conducted through the inter-processor switch 12.

Figure 3:
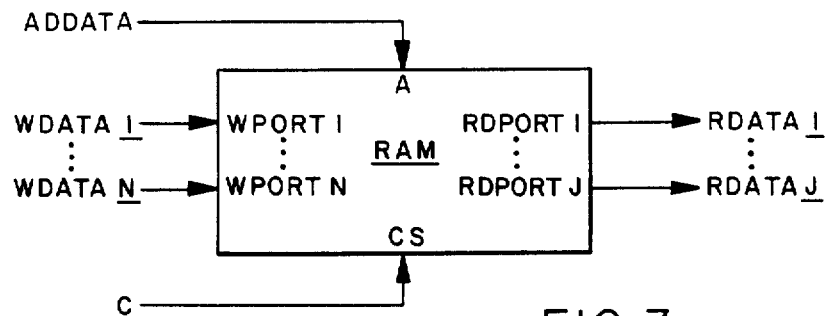
FIG. 3 is an illustration of a memory array simulated by the invention showing how port names are used to define the array.
Figure 4:
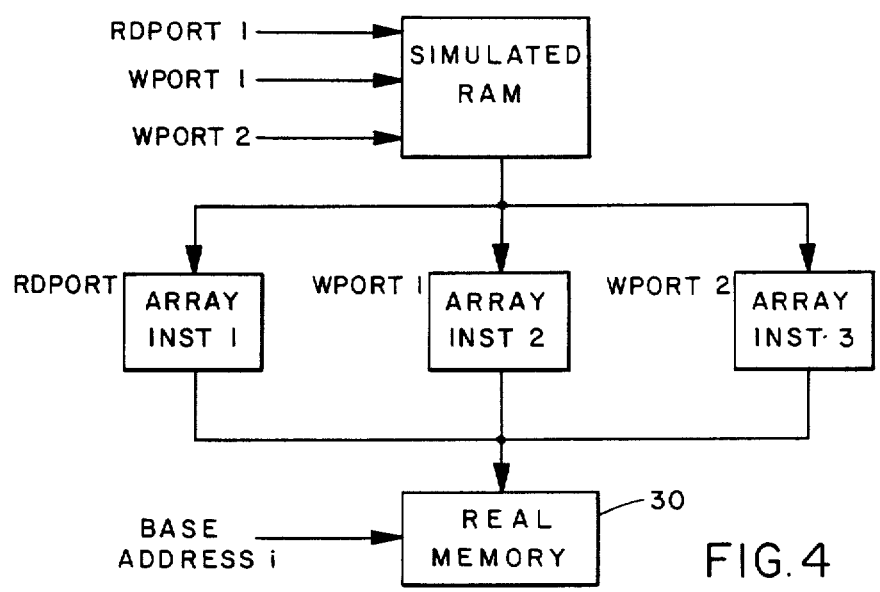
FIG. 4 is an illustration of how the memory array simulation of FIG. 3 is implemented by a combination of software and hardware in the invention.

Refer now to FIGS. 3 and 4 for an understanding of how memory hardware is simulated in the invention by the use of memory array instructions. FIG. 3 represents a random access memory (RAM) that is to be simulated in connection with a particular logic design. As is conventional, the RAM must have at least one address port A through which address data (ADDATA) are received to specify the resource storage sector(s) to be accessed. Access to the RAM is had by way of one or more write ports (WPORT) or read ports (RDPORT). An access operation through a write port, of course, entails the entry of data through a specified write port into a memory sector identified by address data provided to the write port's associated address port. Data is conventionally extracted from an addressed sector of the RAM through a specified read port. As is conventional, memory device operation is gated by a chip (or port) select signal, which is indicated by a control C signal provided through a select port of the RAM.

Assume that the RAM of FIG. 3 is to possess three memory access ports, a read port RDPORT 1, a write port WPORT 1, and another write port, WPORT 2. The group of memory array instructions that fully define the performance of one memory reference through each port are three: array instruction 1, corresponding to a read operation through RDPORT 1, array instruction 2, corresponding to a write operation through WPORT 1, and a third array instruction corresponding to a data entry operation to be conducted through WPORT 2.

The real memory 30 is used to provide authentic memory response to each memory access instruction to be performed during a simulation. The real memory is partitioned into as many sectors as there are memory devices to be simulated. The array instructions representing a given memory device all map into the same partition sector of the real memory. In most cases, all of the array instructions corresponding to a particular memory device are assigned a common real memory base address; the exceptions are discussed below.

When a memory simulation is compiled, the real memory 30 is sectioned to accommodate the memory devices to be simulated. Simulated data, address, and control signal values for each operation to be simulated on each memory are collected in the input data permutation circuit 24. If a read or write operation is indicated by an associated memory array instruction, the memory simulator 20 performs the appropriate real memory access to a compound address consisting of the real memory base address for the sector assigned to the memory device and the address represented by the simulated address signals. If a memory read operation is simulated, data is obtained from the real memory locations indicated by the compound address and is staged through the output data permutation circuit 32.

The RUN mode of operation of the memory simulator 20 is divided into a sequence of cycles during each of which all of the memory array instructions in the simulation profile memory 22 are performed once. Simulated signal values representing data, address, and control bits are collected and arranged in the input data permutation circuit 24 during one cycle and extracted and examined during the following cycle while another set of simulated signals is being assembled. Read data obtained from the real memory 30 during a cycle is held for the duration of the cycle in the output data permutation circuit 22 and forwarded to the inter-processor switch 12 the following cycle.

Figure 6:
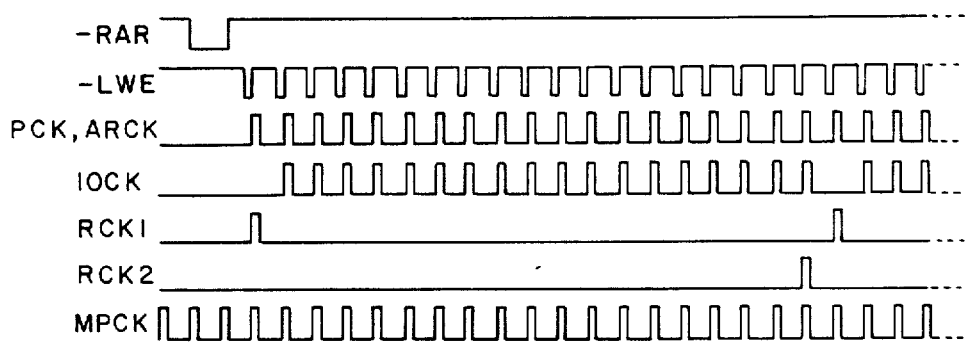
FIG. 6 illustrates clock waveforms that are used to synchronize the flow of data through the hardware embodiment of FIGS. 5A–5B in a pipeline fashion.
Figure 5A:
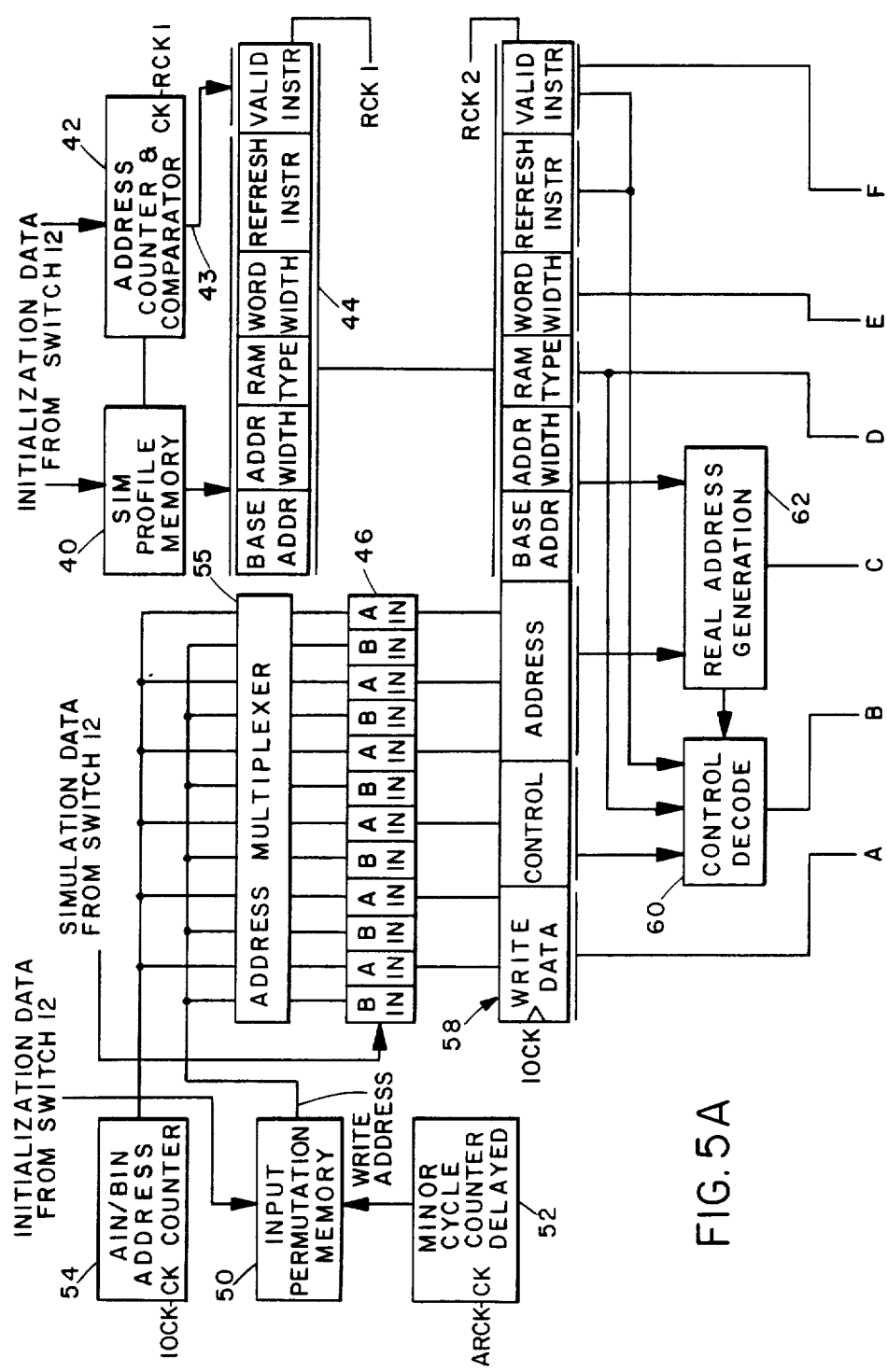
FIGS. 5A and 5B are schematic block diagrams of the hardware embodiment of the invention.
Figure 5B:
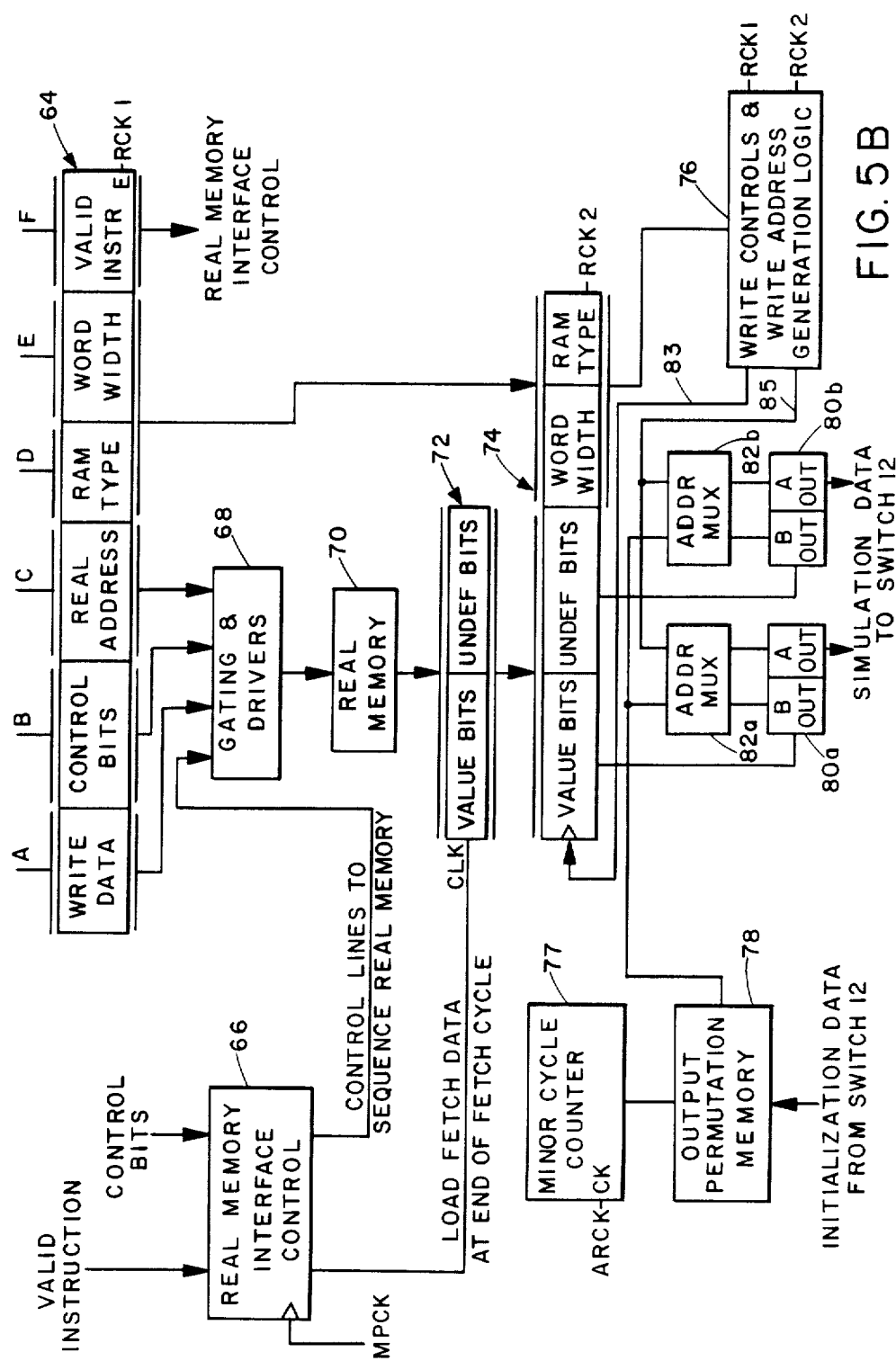

Refer now to FIGS. 5A and 5B and FIG. 6 for a detailed description of the structure and operation of the memory simulator 20. Memory array instructions are stored in and provided from an access instruction circuit including a simulation profile memory 40, an address counter and comparator 42, and an access instruction profile latch 44. the simulation profile memory is a 31 bit by 256 word memory that stores one 31 bit data word for each array instruction to be executed. The array instructions are read out of the simulation profile memory 40 in the sequence of their storage by an address counter and comparator circuit 42.

The address counter and comparator circuit 42 includes, an 8-bit register for receiving a binary number corresponding to the number of array instructions to be executed during each cycle of an on-going simulation. Even if the memory simulator 20 is not to be used during the ongoing simulation, it must still receive an initial binary number corresponding to the number of refresh instructions required by the real memory 30 during the simulation period. The counter of the circuit 42 has the ability to count from zero to the binary number representing the number of array instructions to be executed. The count output is used to address the simulation profile memory 40, and it will be appreciated that as the counter counts from zero to the binary number, the array instructions held in the memory 40 will be addressed in sequence during the count-up on the counter. The address counter and comparator circuit 42 further includes provision for comparing the current counter output with the received binary number. When the counter output equals the binary number value, the counter is stopped. For so long as the counter output is less than the binary number representing the number of instructions, a signal on signal line 43 indicates that the current instruction addressed in the memory 40 is a valid instruction. When the counter output equals the binary value, the comparator output on line 43 indicates that there are no more instructions to execute.

As each array instruction is read out of the profile memory 40, it is entered into the array instruction profile latch 44. For an understanding of the array instruction format, the latch 44 includes a 32-bit register subdivided into the format exhibited by each array instruction to be executed. The first field (BASE ADDR) of an array instruction includes the base address in real memory that defines the storage sector dedicated to the memory device whose port the array instruction represents. In the preferred embodiment, the base address corresponds to address zero in the memory device being simulated. The next field in an array instruction indicates the width of the address field (ADDR WIDTH) of the memory device being simulated For example, an address width of 4 implies an address field for four bits, which define a memory device having the capacity to store sixteen words. This value is used by address generation logic described below when computing the real memory address to determine the number of address bits out of a predetermined maximum number of bits that are valid for a particular simulated memory device.

The array instruction RAM TYPE field indicates the type of array instruction being executed; preferably, the RAM TYPE field consists of one bit in which one state indicates a reference through a read port and an opposite state, a write port reference.

The WORD WIDTH field conveys the word size of the memory device being simulated. This value is used by a below-described output memory control to specify the number of data bits out of a predetermined maximum that are valid for the current array instruction The predetermined maximum number of bits represent the word size (width) of the real memory resource. Thus, for example, if the real memory were 36 bits wide, and a current array instruction were simulating an array having word width of 8 bits, the WORD WIDTH field entry would be 8. Finally, the REFRESH. INSTRUCTION field consists of a single bit used by below-described decode logic to distinguish between a valid array instruction intended to simulate a memory reference operation and a refresh operation to be performed on the real memory. In addition to the array instruction fields, the array instruction profile latch 44 also receives the VALID INSTRUCTION indicator provided by the address counter and comparator circuit 42.

The memory parameter simulation data that flow into the memory simulator 20 through the switch 12 during each major cycle are received and stored in a predetermined permutation pattern. The pattern represents the scheduling imposed upon the data intake operation of the memory simulator by the compilation of a program input by a user. In this sense, permutation refers to the storage of individual units of data as they arrive during a major cycle in storage sectors not related to their place in the sequence of data flowing to the memory simulator from the inter-processor switch 12. Such permutation is necessary because the memory access parameter signals, relating to memory data, address, and control signals are produced by the independent operations of the logic simulations processors 16, 18.

The AIN/BIN memory 46 of the memory simulator includes a pair of identical storage memories, each having six individual elements that are interleaved with the individual elements of the other memory in the schematic illustration of FIG. 5A. Each of the individual elements consists of a 1 bit $\times$ 1024 storage location memory device. One of the two memories of the memory 46 is referred to as the A/IN memory, the other is denoted the B/IN memory. During a cycle, data flowing into the memory simulator are permuted into one of the two memories, while data permuted during the previous cycle are sequentially read from the other memory.

Further describing the memory 46, each of the A/IN and B/IN memories consists of three distinct sections, each comprising a pair of identical memory elements. Memory elements are paired in the preferred embodiment because the unit simulation signal in the LSM of the incorporated patent consists of two bits, one termed the "value" bit, and the other, the "undefined" bit. Reference is made to the Cocke patent for an understanding of the function of these bits. It hould be evident that the paired data structure is included only for an understanding of the operation of the preferred embodiment of the invention in connection with a particular type of logic simulation construct; in practice, the memory 46 (and the output memory described below) can have any structure that accommodates the basic signaling unit of the simulation context in which the memory simulator 20 operates.

Continuing with the description of the preferred embodiment, the following discussion of write and read operations of the memory 46 during the RUN mode of operation will be presented in terms of the A/IN memory. It is to be understood that the description is precisely the same for the B/IN memory.

During the RUN mode of operation, when the A/IN memory is being written to, the address to which the currently-available signal is delivered for storage is determined by the current output of an input permutation memory 50. The input permutation memory in the preferred embodiment stores 1024 words in a linear sequence, and each word is 12 bits wide. Each stored word defines a unique address in the A/IN memory where the currently-available signal is to be stored. The input permutation memory 50 is stepped through sequentially each major cycle and provides the write addresses for the A/IN memory. This allows the A/IN memory to be written to in the permutative order imposed by the compilation of the particular logic design being simulated. The input permutation memory 50 is addressed by a delayed minor cycle counter 52 which simply counts up from 0 to 1024 each major cycle, providing, in sequence, the input permutation memory addresses. In the preferred embodiment, the delayed counter 52 is set to a "negative 5" at the beginning of the each major cycle and is counted down from negative 5 when the cycle begins. The presetting of the delayed counter 52 to the initial value takes into account five LSM pipeline clocks that are consumed before valid input data is received from the inter-processor switch 12.

When written, the A/IN memory elements are accessed in the pairs described above The two high order bits of the write address currently available from the input permutation memory 50 are decoded to select which pair of memory elements are to be written. The remaining 10 bits define the addresses in the selected pair element into which the currently available signal is to be written. Thus, the two bits forming a simulation signal and representing a single data, control, or address bit for a given array instruction are written to the same address in a selected pair of A/IN memory elements. It is reiterated here that the input permutation memory 50 is used to address the A/IN memory so that the memory can be written in any order desired. It will be evident that a given order will be required and the IPM 50 will receive the A/IN addresses in a sequence corresponding to the correct order during the IPL MODE. The order is referred to as a programmed permutation pattern.

As discussed above, the particular operational environment being used to frame the discussion of the invention requires the delayed counter 52 to be preset to "negative 5" or 1019. Thus, the first five invalid signals will be written in the addresses contained in the IPM at addresses 1019-1023. When the first valid signal arrives from the inter-processor switch 14, it is written to the address contained in the IPM at address zero, the next valid data is written to the address contained in the IPM at address one, and so on until the last valid data is written to the address contained in the IPM at address 1023.

In the read aspect of the RUN mode, all three A/IN memory element pairs are accessed simultaneously with the same address. The address is available from the AIN/BIN address counter 54, which is a conventional 12-bit counting device whose current count is used as the read address for the A/IN memory. Only the low order 10 bits of the counter 54 are used to address the A/IN memory (the two high order bits are ignored). The counter 54 counts incrementally from address 0 to address 1023 each cycle.

The A/IN and B/IN memories are alternated in their respective roles once each major cycle by the operation of the address multiplexer 55. The address multiplexer provides both address and R/W control signals to the individual memory elements of the AIN/BIN memory 46. Thus, for example, during one cycle, the address multiplexer will assume one state wherein each A/IN memory element receives a control signal indicating a memory read operation and receives the ten least significant bits of the A/IN-B/IN address counter, while write control signals and the ten least significant bits of the currently-addressed IPM location are sent to the B/IN memory element pair indicated by the high order two bits of the currently-addressed IPM location The next cycle, these functions are reversed.

Simulated memory access parameters are combined with respective array instructions in the AIN/BIN latch 58. The latch 58 comprises two logical pieces: one for staging the memory access parameters fed from the memory 46 and another for storing and forwarding an array instruction received from the array instruction profile latch 44. The first piece of the latch 58 is further subdivided into three fields, each corresponding to a respective type of access parameter. The three access parameters that are staged into the fields in the first section of the latch 58 are denoted in FIG. 5A as WRITE DATA, CONTROL, and ADDRESS. Thus, simulated data to be written during a memory write operation is stored in the latch field entitled WRITE DATA, the control bit (chip or port select signal) is fed to the CONTROL field while the memory address to be referenced by the current array instruction operation for the memory being simulated is latched to the ADDRESS field. In the preferred embodiment, the three latch fields, that is the WRITE DATA, CONTROL, and ADDRESS, comprise serial shift registers, each receiving serial stream of parameter signals from the currently-read portion of the memory 46, and arranging them in a sequential format for a single parallel shift to the next stage of the memory simulator pipeline.

The other portion of the AIN/BIN latch 58 stores an array instruction that is shifted from the profile latch 44. It should be evident that the combination of memory access parameter data from the permutating memory with an array instruction establishes the complete set of information necessary to define a memory reference operation to be conducted at a specified port of a particular memory being simulated. In this respect, referring to the storage fields in the latch 58: the BASE ADDRESS field indicates which simulated memory element is to be operated on; the RAM TYPE defines the type of reference operation (read or write) to be performed; if the reference operation is a write operation, data to be written is in the WRITE DATA field; the simulated address at which the defined operation is to be performed is in the ADDRESS field; while the CONTROL field value determines whether or not a simulated SELECT signal is to be provided to the simulated device.

The control decode circuit 60 comprises a conventional gate array for decoding information contained in the CONTROL, ADDRESS, RAM TYPE, REFRESH INSTR, and VALID INSTR fields of the latch 58. The control decode circuit 60 is essentially a four-state machine whose states are defined by equations (1)–(4).

$$\text{READ} = \text{VALID} \cdot \overline{\text{REFRESH}} \cdot \text{CS} \cdot \text{READ} \cdot (\text{CS and ADD BITS "DEFINED"}) \quad (1)$$

$$\text{WRITE} = \text{VALID} \cdot \overline{\text{REFRESH}} \cdot \text{CS} \cdot \text{WRITE} \cdot (\text{CS and ADD BITS "DEFINED"}) \quad (2)$$

$$\text{REFRESH} = \text{VALID} \cdot \text{REFRESH} \quad (3)$$

$$\text{NO OP} = \overline{\text{VALID}} + (\text{CS OR ADD BITS "DEFINED"}) \quad (4)$$

The READ state of the control decode machine 60 is entered when the array instruction is not a refresh instruction, is valid, and defines a READ operation and when the CONTROL signal is in a state corresponding to the SELECT state of a conventional port or chip select signal. The conditions determinative of the WRITE state of the decode machine 60 correspond to those for the READ state, with the exception that the RAM TYPE signal indicates a WRITE operation. The additional conditions for validity of equations (1) and (2) are that the undefined bits in the CONTROL and ADDRESS fields of the latch 50 are in a state indicating that the compound CONTROL and ADDRESS signals are defined. The decode machine 60 will enter a REFRESH state when a valid refresh instruction has been entered into the latch 58 from the profile memory. Finally, the decode machine 60 will indicate that no operation (NO OP) is to be performed when either the VALID INSTRUCTION field indicates that an instruction is invalid or an undefined CONTROL or ADDRESS bit is set.

The real memory address at which the current array instruction is to be performed is produced by the real address circuit 62, which uses the ADDR WIDTH field of the latch 58 to determine how many bits in the ADDRESS field are valid for the current array instruction. The valid address bits are decoded and added to the base address in the BASE field of the latch. The result is the real memory address for the given memory reference operation.

Once the state of the control decode machine 60 and the real memory address have been determined, the operational flow of the memory simulator passes to the instruction execution circuit.

The instruction execution circuit includes a real address latch 64, a real memory interface control circuit 66, and a gating and driver circuit 68. The real address latch 64 receives the data in the WRITE DATA field of latch 58, a pair of CONTROL BITS that define one of four states decoded by the control decode machine 60, the real address generated by the real address generation circuit 62, and the data in the RAM TYPE, WORD WIDTH, and VALID INSTR fields of the latch 58. The control bits and the valid instruction signal are provided from the corresponding fields of the real address latch 64 to the real memory interface control circuit 66.

The real memory interface control circuit 66 consists of conventional programmable logic that is controlled by an embedded program; the logic responds to the current state defined by the control decode machine 60 and the valid instruction information to control operations performed against the real memory 70.

Figure 7:
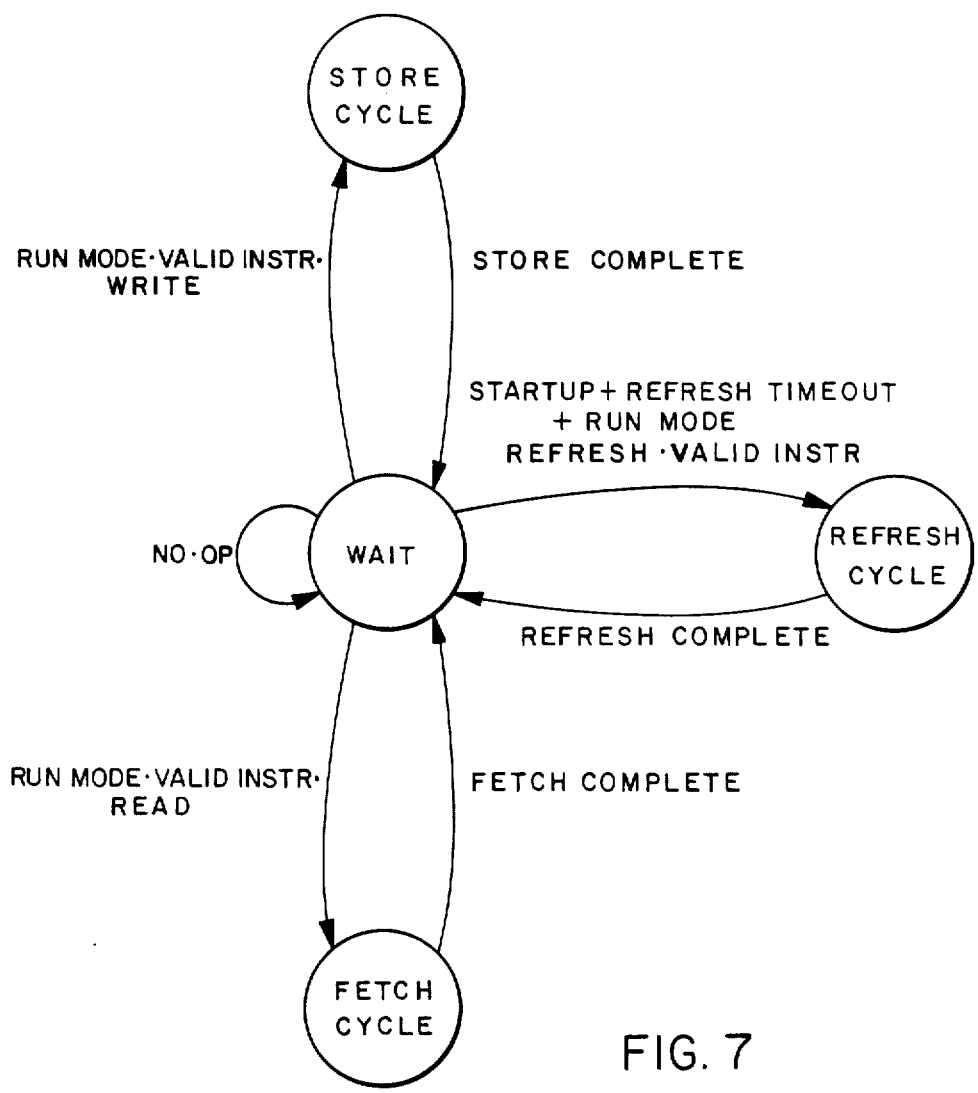
FIG. 7 is a state diagram illustrating the operation of a real memory controller in the hardware embodiment of FIGS. 5A–5B.

FIG. 7 is a state diagram representative of the operation of the real memory interface control circuit 66. Operation includes an initial WAIT state in which the circuit will remain any time the control decode machine 60 generates a NO OP signal according to equation (4) above. A STORE cycle is entered whenever the decode machine 60 produces a WRITE command, the instruction in the real address latch 64 is valid, and the memory simulator is in the RUN mode. Similarly, the control circuit 66 will enter a FETCH cycle when the decode machine 60 indicates a READ operation is to be performed, the address latch instruction is valid, and the simulator is in the RUN mode. During the STORE and FETCH cycles, the control circuit 66 generates appropriate control signals on a plurality of control lines provided to the gating and driver circuit 68. These lines conduct memory access signals that define the simulated memory reference in terms of control signals appropriate to operate the real memory 70; they also conduct address, write data, and control bit gating signals that enable the gating and driver circuit 68 to provide the real address, write data, and control bits held in the real address latch 64 to the memory 70. The memory access and gating signals are presented in the proper order and for the time period specified for correct operation of the memory 70.

Thus, when the instruction currently held in the latch 64 corresponds to a WRITE memory operation, the control circuit 66 will sequence appropriate signals to the gating circuit 68 to cause the gating circuit to provide, in proper order, the control signals, the calculated real memory address, and the data to be stored to the real memory 70. Similarly, for a reference corresponding to a READ. operation, the interface control circuit 66 will provide control signals and the calculated real address to the gating circuit 68 in the sequence required for reading data from the real memory 70. Further, at the end of a real memory FETCH cycle, the control circuit 66 will provide a clock pulse that will cause the fetched data to be loaded into the real memory output latch 72 so that the obtained data can be latched for transfer to the output permutation circuit.

The REFRESH cycle of the control circuit is entered under the conditions defined in equation (3), at start-up of memory simulator operations, or whenever a predetermined refresh time-out period elapses without conduction of a REFRESH operation. In the REFRESH cycle, the control circuit 66 provides the appropriate signals through the gating circuit 68 to conduct a conventional REFRESH operation on the real memory 70.

As illustrated, the real memory output latch 72 latches data read from the real memory 70, with the latching under the control of a clock pulse from the control circuit 66. Because the real memory 70 is asynchronous to the rest of the memory simulator logic, read data is available before the memory simulator is ready to use it. Therefore, the data is held in the latch 72 until it can be transferred to the output permutation circuit. In further explanation of the illustration of FIG. 5B, both the real memory 70 and the real memory output latch 72 have provision for storing the basic signal units defined for the operational context of the preferred embodiment; that is, they provide storage for the "value" and "undefined" bits of each signal unit.

The data latched to the real memory output latch 72 is forwarded to the output data permutation circuit.

The output data permutation circuit consists of a memory data latch 74, a write control and address generation logic circuit 76, a minor cycle counter 77, an output permutation memory (OPM) 78, an A/OUT and B/OUT output memory consisting of value and undefined sections 80a and 80b, and an address multiplexer comprising two sections indicated by reference numerals 82a and 82b.

The memory data latch 74 consists of a latch that receives the results of a real memory read operation from the output latch 72 along with the word width and RAM type instruction for the just-executed operation that is held in the latch 64. Under control of the write control and write address generation logic 76, the read data in the latch 74 is clocked out serially and written into the A/OUT or B/OUT memory. The WORD WIDTH and RAM TYPE data are used by the logic circuit 76 to control how many read data bits are written to the selected memory.

The write control and write address generation logic 76 controls the transfer of simulated read data into the A/OUT or B/OUT memory from the data latch 74. The transfer is controlled by a SHIFT CLOCK signal provided on signal path 83 and an ADDRESS signal and WRITE ENABLE signal provided on the compound signal path 85. The SHIFT CLOCK on the data path 83 serially shifts the data entered in parallel into the memory data latch 74 from the real memory 70. The destination of the serially-shifted data alternates between the A/OUT and the B/OUT memories on alternate cycles, with the value bits going to one of the memory element pair 80a and the undefined bits going to the corresponding one of the memory elements 80b. Write control for entry of the serially-shifted data is provided by the ADDRESS and WRITE ENABLE signals on the compound data path 85. The ADDRESS signal defines the address in the destination memory where the serially-shifted data is to be stored, while the WRITE ENABLE signal effects the entry of the serially-shifted data into the indicated memory location.

To produce the SHIFT CLOCK, WRITE ADDRESS, and WRITE ENABLE signals, the logic 76 includes a write address counting capability that is reset to zero at the beginning of each cycle. Then, as a cycle progresses, the logic 76 increments the write address each time the RAM TYPE field of the memory data latch 74 indicates a read array instruction reaches the latch. Each time the RAM TYPE field indicates a read array instruction, the write address count is incremented by a total equivalent to the value in the WORD WIDTH field, which limits the number of bits written to the output memory to exactly the word width of the memory being simulated by the array instruction that initiated the READ operation. If the WORD WIDTH field value indicates that a data word is less than the real memory word size, the excess data bits in the memory data latch 74 are ignored. When the desired bits have been written into the A/OUT or B/OUT memory, the generation logic 76 points to the first empty memory location following the word just written. The first bit of the next read data word will be stored in the location indicated by the pointer. Thus, the read data is stored contiguously in the output memory. In the preferred embodiment, if a NO OP occurs when a READ operation is indicated by the RAM TYPE field of the latch 74 (as, for example, when undefined bits are detected by the control decode machine 60 or when the control bit associated with the read array instruction indicates no access), undefined data will be written into the selected memory.

Data is extracted each cycle from the output memory by the complementary operations of the minor cycle counter 77 and output permutation memory (OPM) 78. The minor cycle counter 77 is a 10-bit counter used to address the OPM during the RUN mode of operation. It is reset to a negative three at the beginning of each cycle to account for the number of pipeline clocks required to bring valid data to the memory data latch 74. The OPM 78 is a conventionally-addressable memory element having the capacity to store 1024 words of 10 bits each. It is stepped through sequentially each major cycle by action of the minor cycle counter 77, and it provides the read address for the A/OUT or B/OUT memory. This allows the A/OUT and B/OUT memories to be read in any order and the data stored in them to be permuted.

The A/OUT and B/OUT memories are driven out of phase each cycle by operation of the address multiplexer 82a and 82b. Thus, during one cycle, READ ADDRESS signals from the OPM and READ ENABLE signals generated by combinational logic (not shown) associated with the multiplexer will be provided to either the A/OUT or B/OUT, while write addresses and write enable signals originating in the generation logic 76 will be provided to the other of the memories.

The pipeline operation of the memory simulator can be understood by reference to FIG. 6, where a load write enable clock (LWE), processor clock (PCK), address register, clock (ARCK), pipeline clock #1 (RCK 1), pipeline clock #2 (RCK 2), I/O clock (IOCK), master processor clock (MPCK), and cycle preload and clear (RAR) signal are illustrated. All of the clocks except MPCK are provided by conventional clock circuitry (not shown) which corresponds to the clock generator 33 of FIG. 2. These clocks are ultimately derived from the LWE clock available from the LSM. The MPCK and RAR signals are provided from the control processor 10.

The LWE clock is received from an external source; in the preferred embodiment, it is received directly from the control processor 10. Preferably, the LWE clock has a 50 nanosecond pulse with a periodicity of approximately 167 nanoseconds. During the RUN mode of the memory simulator 20, the LWE clock is a continuous stream of pulses. The write enable signals for the A/IN and B/IN memories 46 are derived directly from the LWE clock during the RUN mode. The IOCK, PCK, and ARCK signals are derived by inverting the LWE clock and delaying the inverted waveform by 50 nanoseconds. IOCK stays inactive every 19th pulse of LWE (equivalent to a missing pulse) in RUN mode. The ARCK is used to clock the minor cycle counter delayed 52 and the minor cycle counter 77 during the RUN mode of operation. Thus, when data is being entered into the memory simulator 20 through the memory 46, the address of the IPM 50 is incremented through the minor cycle counter delayed 52 on a particular transition of each pulse of ARCK. Data is written to the memory 46 on the corresponding transition of the following pulse of LWE, thereby establishing the correct phasing for the writing of simulated data access parameters into the memory 46. Corresponding timing relationships are, established for reading data from the memories 46 and 80a, 80b.

The IOCK signal is fed to the address counter 54 and to the serially-shifted WRITE DATA, CONTROL, and ADDRESS sections of the AIN/BIN latch 58 to serially clock into those sections data which is serially read from the input memory 46 by the counting action of the address counter 54. Since the counter 54 is counted up in response to IOCK, the use of IOCK in the serial input subsections of the latch 58 synchronizes the transfer of data to those subsections from the memory 46. Similarly, ARCK causes the read address from the OPM 78 to change in synchronism with the LWE, thereby insuring that data is transferred from the memories 80a, 80b to the switch 12.

The memory simulator 20 is operated in a pipeline fashion by virtue of the phasing of the pipeline clocks RCK 1 and RCK 2. RCK 1 is the primary pipeline clock; it is derived from PCK and is active only during the RUN mode. RCK 1 occurs with the first pulse of PCK and once every 19 pulses of PCK thereafter. The second pipeline clock, RCK 2, is also derived from PCK and is active only during the RUN mode. RCK 2 occurs once every 19 pulses of PCK and is coincident with the PCK pulse occurring immediately prior to RCK 1.

Figure 8:
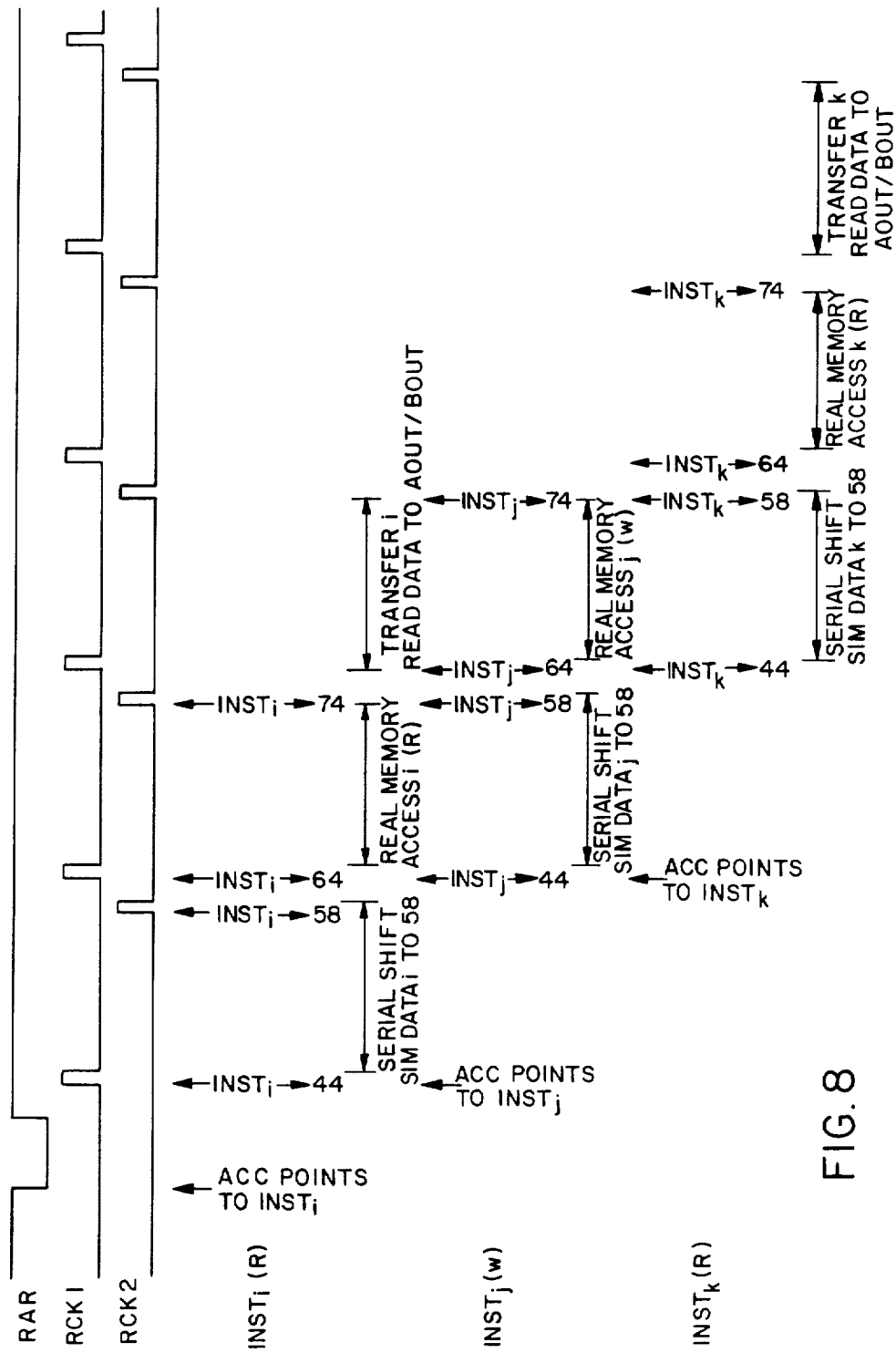
FIG. 8. is a timing diagram illustrating the pipelined operation of the hardware embodiment of FIGS. 5A–5B.

The pipeline operation of the memory simulator is illustrated in FIG. 8 where the path of three successive instructions from the SPM 40 are traced. The first instruction read, $INST_i$, is assumed to be one requiring the real memory 70 to be read, which is indicated by (R). The second instruction, $INST_j$, is a write (W) instruction, while . the third instruction, $INST_k$, is another read (R) instruction. The phasing of the pipeline clocks is shown horizontally across the top of the FIG. 8 graph.

The sequence is as follows. On the first occurrence of RCK 1, $INST_i$ is latched to the instruction profile latch and the address counter and comparator circuit 42 (ACC) is incremented to the SPM address where $INST_j$ is stored. Between the first occurrence of RCK 1 and the following RCK 2, data defining the simulated read address and the control bit for $INST_i$ is serially shifted from the A/IN or B/IN memory to the AIN/BIN latch (ABL) by IOCK. Now, tracing the horizontal line illustrating the progress of $INST_i$, at the first RCK 2 following the instruction's entry into the IPL and the corresponding read parameter data into the ABL, $INST_i$ is latched into the ABL. Immediately upon $INST_i$ being latched to the ABL, the control decode and real address generation for the instruction are performed.

On the second occurrence of RCK 1, the control bits and generated real address for $INST_i$ are clocked, together with the information in the RAM TYPE, WORD WIDTH, and VALID INSTR fields of the instruction into the real address latch 64 (RAL). At the same time, $INST_j$ is entered into the IPL and the ACC count is incremented to point to $INST_k$.

Between the second occurrence of RCK 1 and the following occurrence of RCK 2, the real memory 70 is read at the real address in the RAL and the read data is clocked into the real memory output latch 70 (RMOL). At the same time, the memory reference parameter data (WRITE, CONTROL, and ADDRESS) is serially entered into the ABL to set the conditions for execution of the STORE operation required for $INST_j$.

On the RCK 2 pulse following the second occurrence of RCK 1, the data fetched from the real memory in execution of $INST_i$ is entered into the memory data latch 74 (MDL) from the RMOL 72. As described above, this data is shifted from the MDL into the memory 80a, 80b by the action of the generation logic 76 described above. At the same time, the STORE operation required for $INST_j$ is set up by decoding of the control bits and generation of the real memory address.

On the third occurrence of RCK 1 the write data, control bits, and real memory address, together with the information in the RAM TYPE, WORD WIDTH, and VALID INSTR fields of $INST_j$, are entered into the RAL 64, following which the STORE operation for the instruction is executed. On the same occurrence of RCK 1, $INST_k$ is entered into the IPL, and the progress of this instruction follows that of the first.

Figure 9:
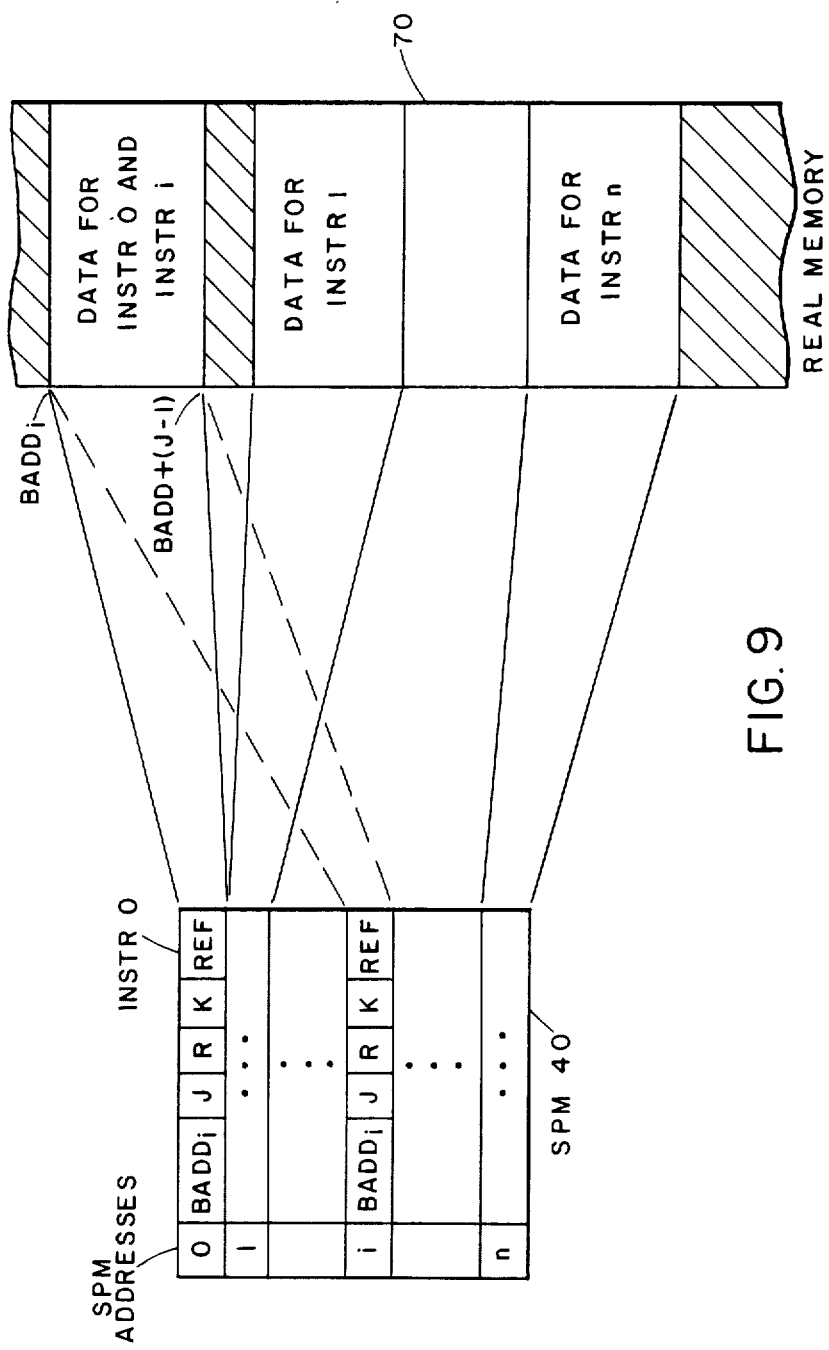
FIG. 9 is a diagram illustrating the partitioning of the real memory of FIG. 5B.

Reference is now made to FIGS. 9, 10A-10C, and 11A-11C for an understanding of how the real memory 70, input memory 46, and output memory 80a, 80b, respectively, are partitioned and accessed during the operation of the memory simulator 20. As shown in FIG. 9, the simulation profile memory (SPM) 40 has instructions stored at consecutive addresses that are accessed in sequence as explained hereinabove. Referring now to the first instruction INSTR 0 at SPM address location 0, a field of the instruction contains a real memory base address, $BADD_i$, that defines the first address in the real memory 70 where data for the memory reference simulated by instruction INSTR 0 is held. The field of the real memory 70 devoted to instruction INSTR 0 ends at $BADD_i+(J-1)$, where J is the value in the address width field of instruction INSTR 0. Other instructions in the SPM 40 representing memory reference operations against the same simulated memory device will also have the base address $BADD_i$. For example, if instruction INSTR 0 simulates a write operation, it may be that a read operation is to be executed against the written data. In this case, the subsequent read operation would be conducted by a FETCH operation against the data written to the real memory 70 beginning at storage location BADDi by instruction INSTR 0. The partitioning of the real memory 70 is done during IPL and is implemented through compiler assignment of base addresses to array instructions.

Figure 10A:
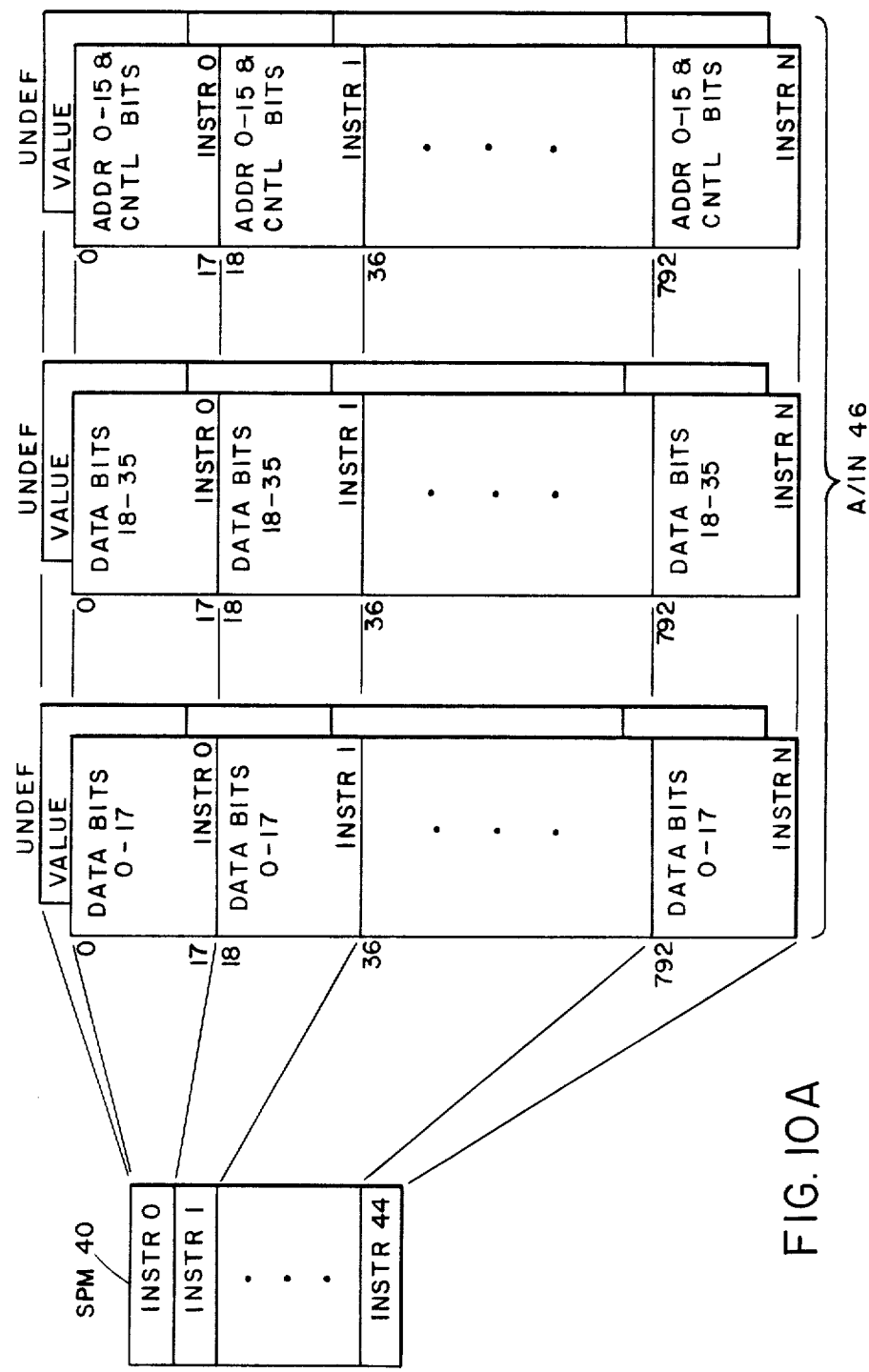
FIGS. 10A–10C illustrate partitioning, writing to, and reading from the AIN/BIN memory of FIG. 5A.

The input memory 46 is partitioned during IPL, and the partitioning can be understood with reference to FIG. 10A. FIG. 10A illustrates the three element pairs of the A/IN portion of the memory 46, however, it is to be understood that the illustration and explanation which follow are valid also for the B/IN portion of the memory. Each element of a pair of the A/IN memory consists of a one bit by 1024 location storage device. In the preferred embodiment, provision is made for simulation of memory devices having the ability to store words up to 36 bits in length in up to 64K storage locations; therefore, provision is made in the A/IN memory pairs for receiving words and addresses of the maximum size, as well as the control bits for each instruction. This is illustrated in FIG. 10A by the partitioning of the A/IN memory elements as follows. For each instruction in the SPM 40 and therefore for each simulated port, the same 18 storage spaces are reserved in. each of the A/IN elements, with the space in the first pair of elements dedicated to the first 18 bits of a data word, the identical storage sectors in the second element pair to the second 18 bits of a data word, and corresponding storage sectors in the third pair of elements dedicated to 16 address bits and one control bit. As shown in FIG. 10A, this results in the dedication of the first 18 storage spaces in each element of all of the A/IN pairs to the accumulation of simulation data for the first instruction.

Figure 10B:
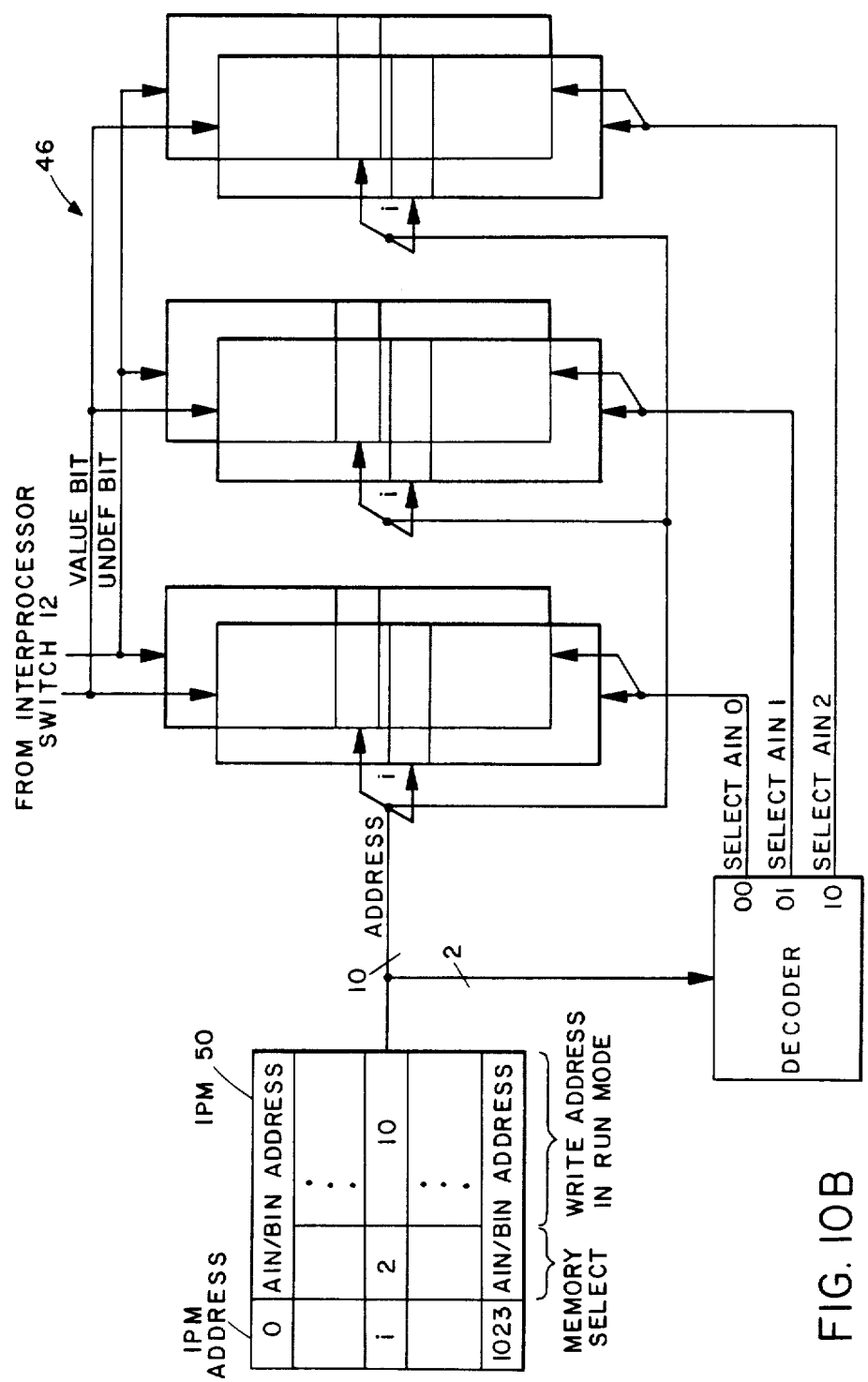

Permutation of data flowing into the memory 46 from the switch 12 during a major cycle is illustrated in FIG. 10B. As described above, the IPM 50 has 1024 separately addressable storage spaces in each of which is stored the address in the memory 46 where a simulation signal from the switch 12 will be stored. It will be understood that the compiler will have the ability to schedule the delivery of simulated memory access signals to the memory simulator during each cycle. That delivery schedule is reflected in the AIN/BIN memory addresses stored in the IPM 50 during the IPL mode of operation. During the RUN mode of operation the IPM addresses are provided in sequence and each prompts the provision of the address at which the currently-provided signal bits are to be stored. As illustrated, the upper two MSB's of the address are decoded to select one of the three memory element pairs, while the ten LSB's specify the particular address in the selected memory pair where the currently-available value and undefined bits are to be stored.

Figure 10C:
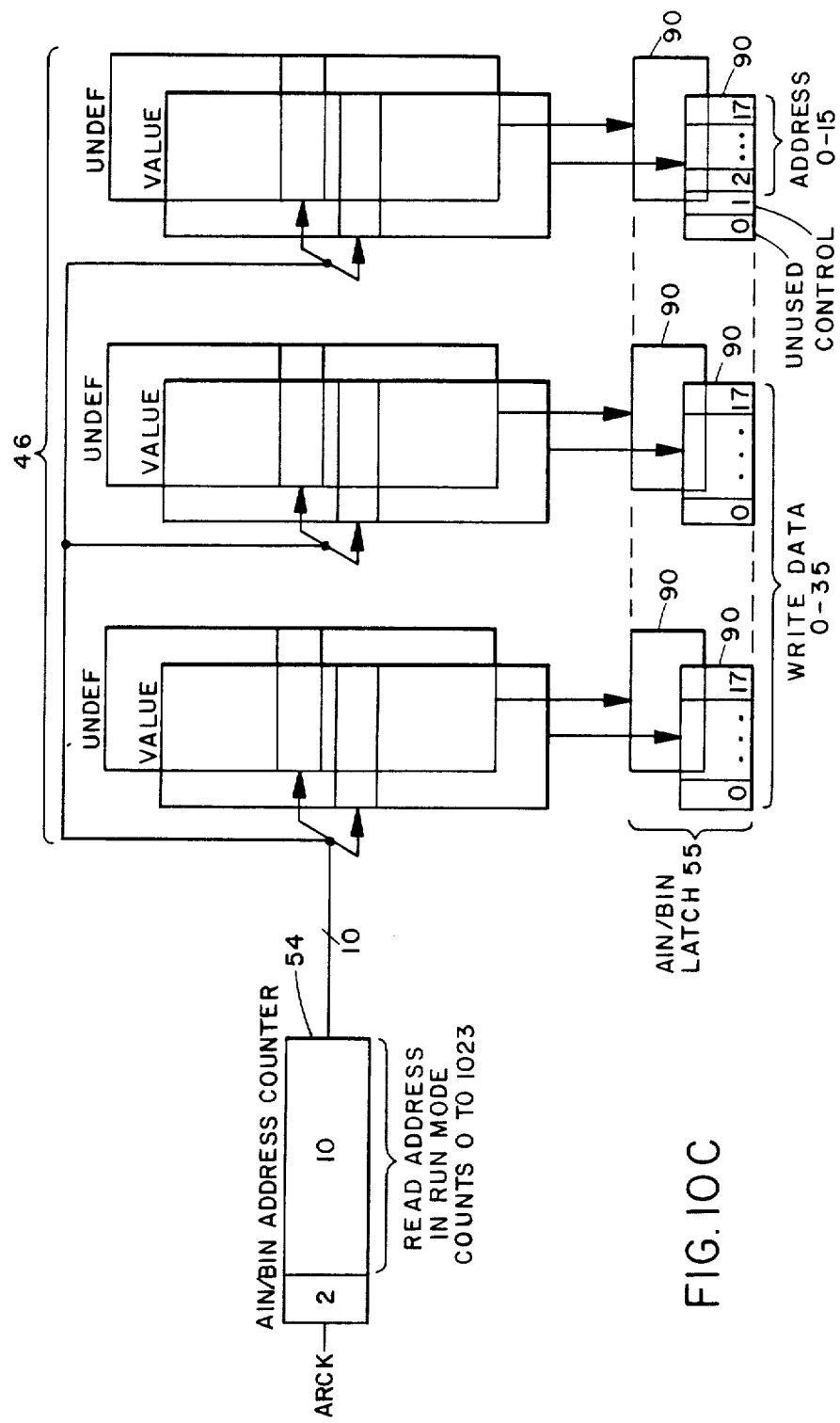

FIG. 10C illustrates the reading of data stored in the A/IN memory pairs. It will be recalled that data is read sequentially from the memory 46 under control of the address counter 54. The address counter 54 is reset to 0 at the beginning of each major cycle and counts incrementally from 0 through 1023, which will result in the data stored in the A/IN pairs being read out sequentially to the AIN/BIN latch 58. The first three fields of the latch 58 are stored in three pairs of serial-in-parallel-out shift registers. These registers are indicated in FIG. 10C by reference numeral 90; each consists of an 18-bit device. Data is shifted serially from each A/IN memory element into an associated one of the registers 90 during the 18 PCK cycles that occur between each cycle of RCK 1. Thus, each of the registers 90 will be filled with 18 bits of data from 18 contiguous storage spaces in one of the A/IN memory elements. Then, at the next RCK 1, the data are transferred to the next stage of the pipeline. As shown in FIG. 10C, the WRITE DATA field of the latch 58 consists of the data in the first two sets of registers 90. The CONTROL bits are in the second storage spaces of the last pair of registers, while the ADDRESS field information is held in register storage cells 2-17 of the last register pair.

Figure 11A:
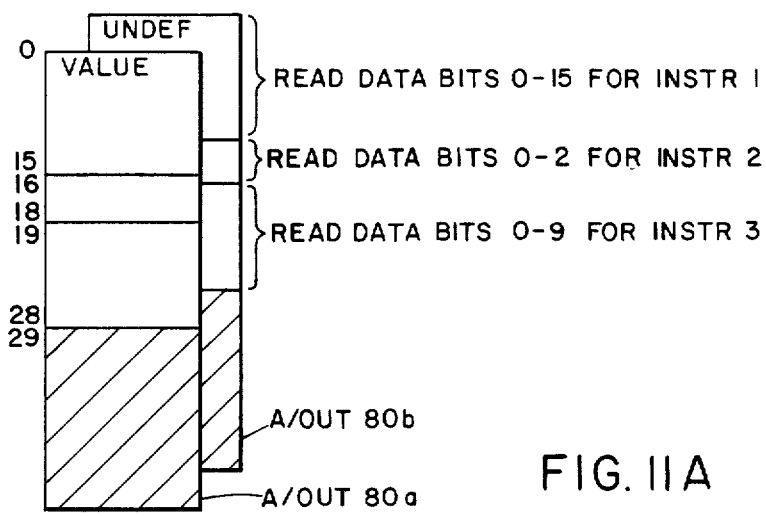
Figure 11B:
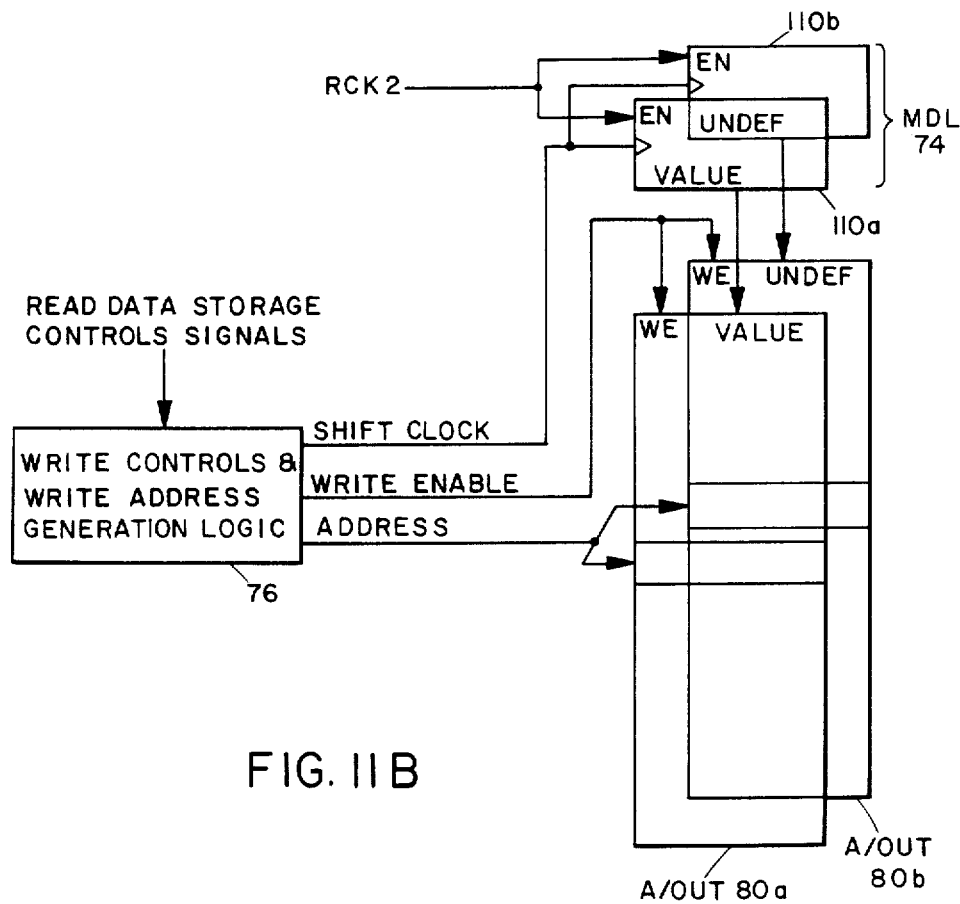

The operation of the output permutation memory 80a, 80b will be understood by referring to FIGS. 11A-11C. As shown in FIG. 11A, the value and undefined bits resulting from three read memory instructions are stored in consecutive locations in A/OUT memory elements 80a and 80b, respectively. Assume that the word widths for the three instructions are: 16, 3, 10. The partitioning of the memory elements 80a, 80b results in the 16 data bits of the first instruction being delivered to locations 0-15; the 3 data bits of the second read instruction are in locations 16-18; and the 10 data bits of the third instruction are in locations 19-28.

Refer now to FIGS. 11B and 11C for an understanding of write and read functions performed on the AOUT/BOUT memory. The address multiplexer 82a, 82b is not shown in FIGS. 11B and 11C since it only alternates the write and read control signals illustrated in these Figures between the A/OUT and B/OUT memories each machine cycle.

Figure 12:
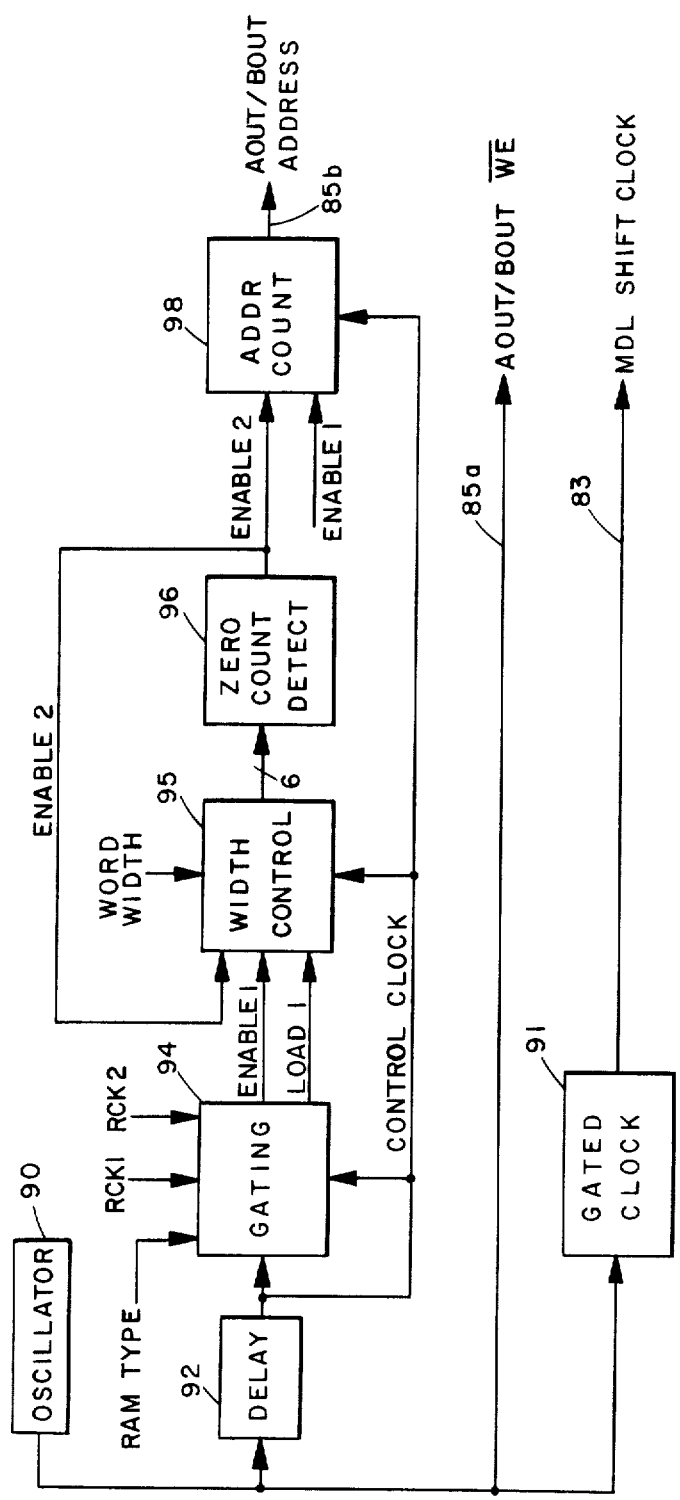
FIG. 12 is a block diagram of write control and write address generation logic of FIG. 5B.
Figure 13:
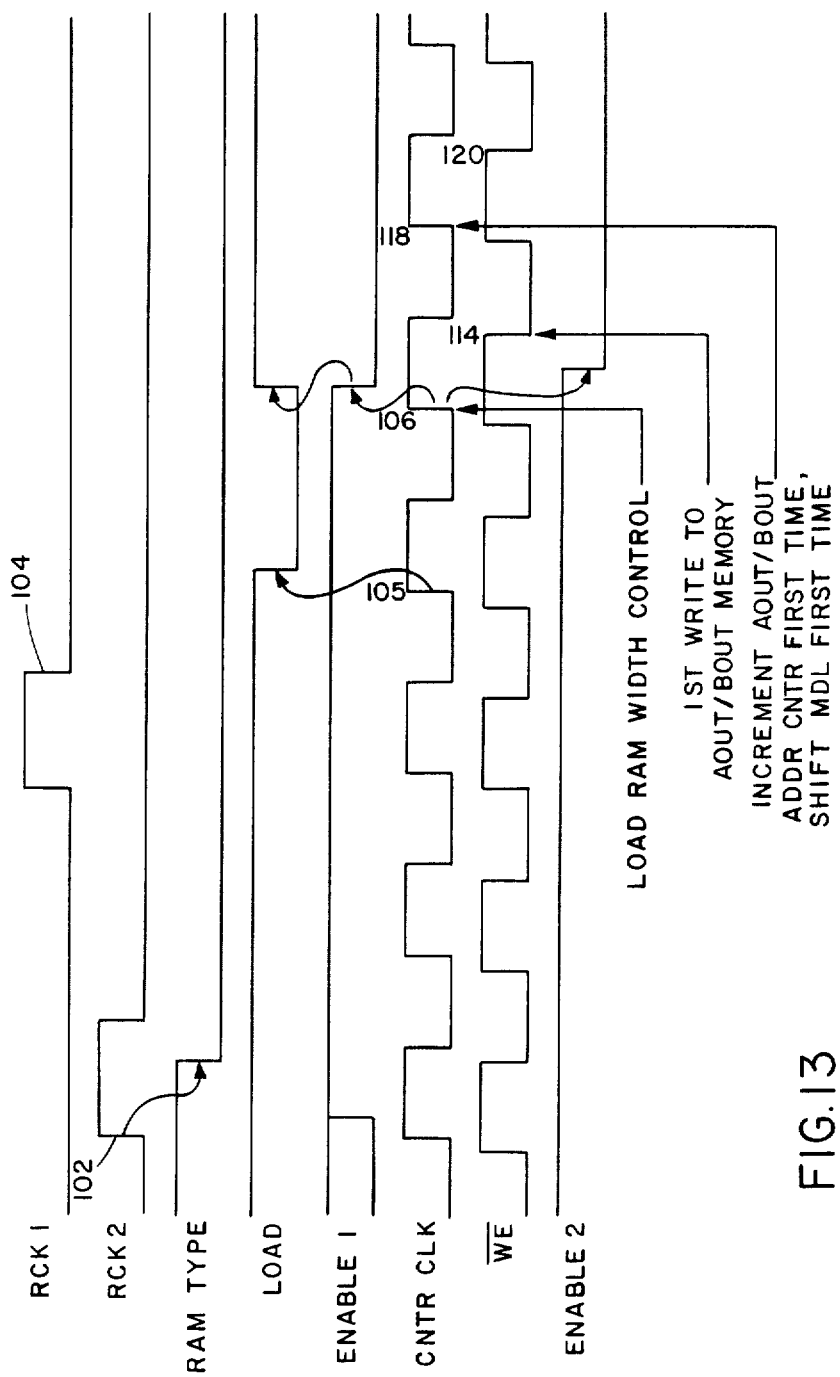
FIG. 13 is a waveform diagram illustrating operation of the logic of FIG. 12.

Writing the read data bits to the memory element is illustrated in FIGS. 11B, 12, and 13. In FIG. 11B, the write control and write address generation logic 76 provides address and control signals necessary to store read data from the memory data latch (MDL) 74 to consecutive storage locations in the A/OUT memory elements. As shown in FIGS. 11B and 12, the generation logic 76 generates the necessary address, enable, and MDL shift clock signals in response to read data storage control signals including RCK 1 and RCK 2 and the information stored on the RAM TYPE and WORD WIDTH fields of the MDL 74. Generation of the address, enable, and MDL shift clock signals entails the operative collaboration of an oscillator 90, a gated clock circuit 91, a delay circuit 92, a gating circuit 94, a width counter (CNTR) 95, a zero count detector 96, and an address counter (ADD COUNT) 98.

The oscillator 90 is conventional and generates an output oscillatory clock signal on signal line 85a (see FIG. 5B) that is denoted as the AOUT/BOUT $\overline{WE}$ (WRITE ENABLE); this signal enables the entry of data into the AOUT/BOUT memories. The $\overline{WE}$ signal on line 85a is delayed slightly through the delay circuit 92 to provide a counter clock (CNTR CLK) that is used to clock the counters 95 and 98. The counter clock signal is provided to the gating circuit 94 to synchronize writing the AOUT/BOUT memories with the pipeline clocks. When the gating circuit 94 decodes a read instruction, it produces LOAD and ENABLE 1 signals. The LOAD signal enables the width counter 95 to be preset to the value in the WORD WIDTH field. The ENABLE 1 signal is fed to the counters 95 and 98. When the width counter 95 is preset to a non-zero value, the zero count detection circuit 96 provides an enable (ENABLE 2) signal to the width and address counters 95 and 98. When both ENABLE signals are available, both of the counters 95 and 98 are able to count in synchronism with the CNTR CLK signal: the width counter 95 counts down to zero from its preset value; and the address counter 98 counts up. When the width counter 95 reaches a zero count, the zero count detector 96 removes the ENABLE 2 signal from the width and address counters 95 and 98.

The address counter 98 is zeroed at the beginning of each cycle and counts up in synchronism with CNTR CLK each time it is enabled by the detection circuit 96. Therefore, for each read instruction, the address counter will increment its count by a value equal to the value in the word width field of the instruction, and will count up during the instruction from the count at which it was stopped at the end of the previous read instruction. Therefore, the output of the address counter 98 is a sequentially increasing count that forms the sequential addresses provided on signal line 85b to the A/OUT memory elements 80a, 80b.

The $\overline{WE}$ signal line 85a is also input to the gated clock 91 generating the serial shift clock of the MDL on signal line 83. The MDL shift clock serially shifts out the read data previously entered in parallel to the MD 74 from the real memory 70. The gaLed clock circuit 91 is conventionally gated by the signals ENABLE 1 and ENABLE 2 so that shifting from the MDL to the AOUT/BOUT memories is done only when required. For example. no MDL shift clock is required when the MDL is being parallel loaded by RCK 2, or if a write array instruction is being executed.

The time relationships between the various signals that affect the writing of data to the AOUT/BOUT memories is shown in FIG. 13. At the beginning of each cycle, RAR causes the gating circuit 74 to reset the LOAD signal; ENABLE 1, on the other hand, is reset to its inactive state by RCK 2 if the previous RCK 2 has loaded a read array instruction. At the positive transition 102 of RCK 2 assume that the MDL 74 has latched to it read data bits and WORD WIDTH and RAM TYPE field information. The transition 102 causes the gating circuit 94 to reset its ENABLE 1 signal. Immediately after the RCK 2 transition, the RAM TYPE signal from the corresponding MDL storage location assumes a state corresponding to a READ operation. The response of the gating circuit 94 to the READ indication is delayed until the first transition of CNTR CLK following the RCK 1 pulse 104. The counter clock transition 105 causes the gating circuit to produce a set pulse of the LOAD signal that lasts for one cycle of the CNTR CLK and causes the width counter 95 to be preset at transition 106 of CNTR CLK to the value in the WORD WIDTH field of the MDL. At the end of the LOAD pulse, the gating circuit 94 sets the ENABLE 1 pulse; next the count detector 96 sets the ENABLE 2 pulse; following this, the ENABLE pulses permit the counters 95 and 98, respectively, to begin counting in synchronism with the CNTR CLK. First bits are available from the MDL shift registers (110a and 110b in FIG. 11B) when the MDL is loaded at RCK 2 so no shift of the bits is required before the first write to the AOUT/BOUT memory. After the load by RCK 2, CNTR CLK shifts the bits serially from the MDL.

The first write to the A/OUT memory elements occurs on the negative edge 114 of WE; at transition 118 of CNTR CLK, the next value and undefined bits of read data are available from the MDL shift registers 110a, 110b; and the A/OUT address at which these 2 bits are to be written is generated. The bits are written at the negative transition 120 of WE. This process continues to enter bits sequentially into the A/OUT memory elements 80a, 80b until a zero count is detected from the width counter 95, at which time ENABLE 2 will be changed by the detector 96 to a state disabling both counters 95 and 98 from incrementing any further; ENABLE 1 will be reset with the next RCK 2 or RAR.

Output permutation of the data entered sequentially into an AOUT/BOUT memory pair is accomplished as illustrated in FIG. 11C. During the IPL mode, the OPM 78 has a sequence of AOUT/BOUT memory addresses entered into its storage space. The AOUT/BOUT addresses are stored in a sequence corresponding to the OPM address sequence, but define an AOUT/BOUT address sequence imposed by the host/interface processor compiler to synchronize the delivery of read data to the overall simulation being conducted on the logic simulation machine. In the preferred embodiment, the output permutation memory addresses comprise 10-bit values, each defining a unique one of 1024 1-bit storage spaces in each of the A/OUT memory elements 80a, 80b. The destination of the information extracted from the output permutation memory is the interprocessor switch 12.

Therefore, in FIG. 11C, the OPM 78 may have a sequence of addresses in it that include the sequence fragment indicated by OPM addresses 078-080. At these addresses are stored A/OUT addresses i, j, and b, respectively. Thus, it should be evident that the sequence fragment 078-080 of OPM addresses, together with the A/OUT addresses stored at those locations, provide a unique mapping that extracts information stored sequentially in the A/OUT in a nonsequential, but predetermined permutation pattern.

Figures 14, 15:
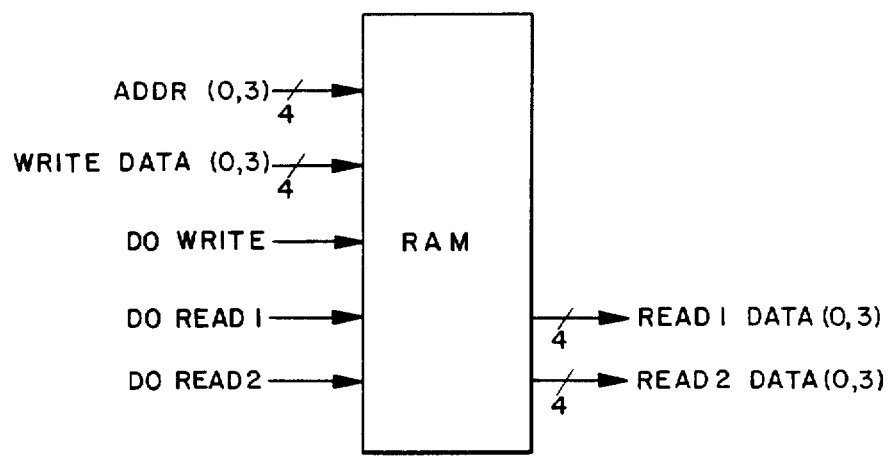
FIG. 14 is an illustration of a three-port memory device being simulated.
FIG. 15 illustrates an exemplary set of array instructions for simulating the device of FIG. 14.

The method and apparatus described hereinabove provide several unique features that are best understood by way of operational examples. The first feature illustrates how the well-known technique of "write through" can be simulated. "Write through" refers to the ability of a memory device to write and read a data object simultaneously with the read operation reflecting the data object being written. In this respect, a three port array is postulated having one write and two read ports. The array is further specified to have the capacity of storing 16 four-bit words. Therefore, its address bus must be at least 4 bits wide to permit addressing the 16 words; and the data input and output busses must also be 4 bits wide to conduct the data words into and out of the device. Further, three separate control ports are specified, each for selecting a respective one of the three data throughput ports. The simulated device is illustrated in FIG. 14 as a random access memory (RAM). The four-bit wide address bus connected to the simulated RAM denoted in FIG. 14 by ADDR (0,3). In this notation, ADDR refers to the address bus, while the parenthetical notation provides explicit names for each of the address bus signal paths. A similar notation is followed for the write and read data busses connected to the respective write and read ports of the RAM. In this example, each port is to be controlled by its own dedicated control port, with, for example, the write control port denoted as DO WRITE.

It is postulated in the instant example that the simulated RAM is to be referenced more than once during each of a number of consecutive major cycles during the RUN mode of operation. In this regard a major cycle consists of an arbitrary number of machine cycles. The array instruction formats are illustrated in FIG. 15. The array instructions for the simulation are stored consecutively in the SPM 40 at SPM address locations j, j+1, and j+2, respectively. The array instruction fields are abbreviated as follows. BA refers to the base address field in which the real memory address i refers to the first address in the real memory storage sector assigned to the simulated RAM. The address field is denoted by AW, and contains a value equal to the width of the address bus (4). RT refers to the RAM TYPE field in which 1 corresponds to a read instruction, while 0 indicates a write. The WW field is the WORD WIDTH field and contains a 4, indicating a data object size of 4, and implicitly defining the write and read busses as being 4 bits in width. The REFRESH instruction field contains a 0 indicating that the array instruction should not stimulate a REFRESH operation for the real memory.

Figure 16:
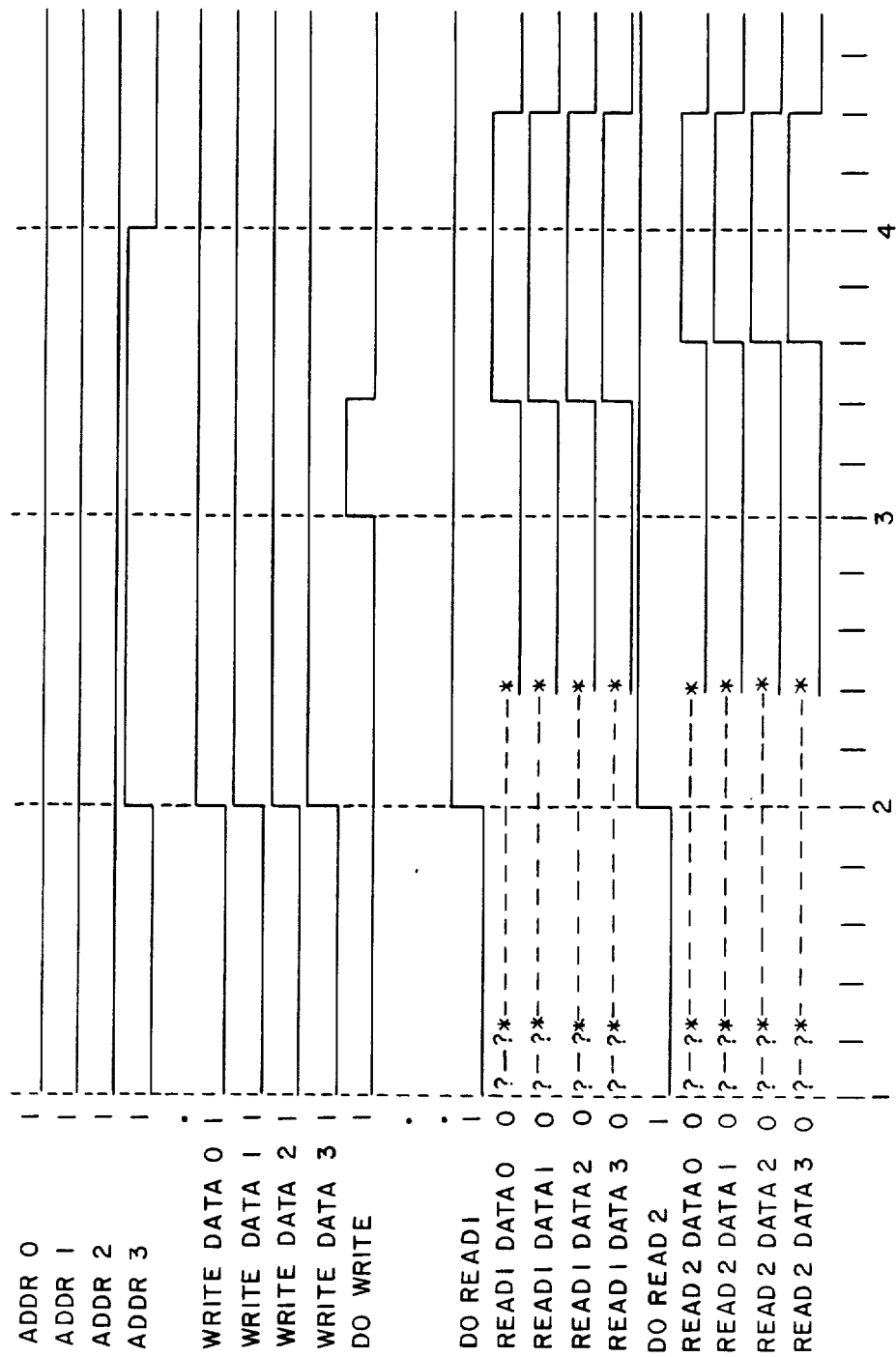
FIG. 16 is a waveform diagram illustrating the operation of the invention in simulating the memory array of FIG. 14.

The waveforms in FIG. 16 illustrate an actual simulation performed by the inventor using the embodiment described for the instant example. The initial conditions of the array simulation included initialization of the array information to all zeros during IPL and ordering of the array instructions so that the instruction representing the READ 2 port precedes the instruction representing the WRITE port, while the WRITE port instruction precedes the READ 1 instruction. These initial conditions were realized through the conventional operation of the compiler in the host processor of the prior art system.

In FIG. 16, the simulation is illustrated by waveforms representing the decoding of value and undefined bits representing a given data bit in the portions of the CONTROL, ADDRESS and WRITE data fields of the AIN/BIN memories and the READ data fields of the AOUT/BOUT memories. Additionally, the decoded bits of the CONTROL data fields for each port are represented. Uninitialized data is represented by ?, while undefined data is denoted by *, logical zeroes and ones conventionally represented by corresponding wave levels.

The simulation is shown proceeding through approximately four major cycles during RUN mode. In FIG. 16, when the simulation begins, the control lines for each port are inactive, corresponding to a logical zero at each of the DO (control) lines. This indicates that no memory reference is being executed against the associated port. In the preferred embodiment, when a read array instruction is associated in the latch 58 with a CONTROL field value of 0, no read memory access occurs and the read data transferred to the A/OUT or B/OUT memory is forced to the undefined state. This is indicated in the first major cycle of FIG. 16 by *.

During the first major cycle, write and address data are defined, while the read data obtained from the real memory 70 are uninitialized. It should be understood that the real memory 70 can have initial data entered into it during IPL; however, in this example the memory is uninitialized.

At the beginning of the second major cycle, during the first machine cycle, defined data for the read control lines (DO READ 1 and DO READ 2) and the address port are transferred to the memory simulator 20 from the switch 12 and are captured in the A/IN or B/IN memory. Beginning with the second machine cycle of major cycle 2, the read control and address signals are taken from the A/IN or B/IN memory, real memory access is performed, and read data is stored in the A/OUT or B/OUT memory. Beginning with the third machine cycle of the second major cycle, the read data is passed to the interprocessor switch 12 from A/OUT or B/OUT memories.

At the beginning of the third major cycle, the write control line DO WRITE becomes active, the address is still address 1, while the write data is again all ones. The read control lines are active during the third major cycle. Now, the positive state of the DO WRITE control line causes the simulated data to be entered into the real memory 70 during the first two machine cycles of the third major cycle. At the beginning of the third machine cycle, the data written at the indicated address changes to all ones at the first read port. Because the read instruction representing the second read port precedes the write instruction, it doesn't "see" the new data until one machine cycle after the new data is "seen" by the first read port. Thus, the all ones written are not available to the second read port until one machine cycle after the new data is available from the first read port. The "write through" simulation is thus provided by the recognition at the first simulated read port of data entered into the simulated RAM through the WRITE port during the same machine cycle of the simulator 20 (that is, the third machine cycle of the third major cycle).

The memory simulator of the invention inherently has two levels of delay between starting a simulated reference (read or write) and seeing the results flowing through the switch 12. Ordering a read array instruction after a write array instruction provides that the write instruction data can be read as soon as possible after execution of the write array instruction. If the instructions are ordered so that a read instruction precedes a write, an additional machine cycle of delay is incurred. Most simulation scenarios can tolerate this additional level of delay.

However, if the extra level of delay between a write and read instruction is unacceptable, the designer has the option of ordering instructions so that the write instruction precedes the read instruction.

The other feature provided by the invention permits the simulation of a memory device having data objects wider than the data width storage capability of the real memory 70. In the case where a memory device is simulated whose data width is greater than, for example, the 36 bit maximum available in the real memory 70, the simulated device is represented by two (or more) array instructions, each with a word width field (W) of 36 (or less) bits. This permits the two array instructions corresponding to the two separate pieces of the same memory device to be executed independently. In this case, the simulated address and control data for each piece would be identical, with the only difference being in the data written or read during each instruction. The simulated memory device therefore would have two independent array instructions compiled for each port to be simulated (each instruction accounting for one section of the data field), and each instruction would be assigned by the compiler a separate area of real memory 70 against which its operations are to be conducted. Of course, each separate area of the memory 70 would be accessed by its own base address.

Finally, the invention provides for simulation of a memory device whose addressable size exceeds the 64K word maximum represented by a single array instruction (as a consequence of the 16-bit wide address width field). In this case the memory device can be partitioned into two (or more) pieces of 64K words (or less) each, in which the high order address bit (or bits) would be used to gate the control lines to each partition, effectively providing unique control lines to each partition. The remaining address lines and the data lines are common in this case to both partitions. In this respect, the instructions would be. assigned separate areas of the real memory, each having a respective base address, and each corresponding to a respective partition of the memory being simulated.

Therefore, it will be evident that any memory device of arbitrary width and storage capacity and possessing an arbitrary number of reference ports can be simulated using the method and means of the invention. It will further be appreciated that any memory reference operation conducted against any simulated memory device will be operative to affect a data object of arbitrary size, in contradistinction to the logic simulation machine of the prior art in which each simulated operation can be conducted only against data objects one bit in width.

Obviously, many modifications and variations of the present invention are possible in light of the above teachings; therefore, it is to be understood that the invention may be practiced in embodiments other than those specifically described.

I claim:

1. A method for simulating multi-port memory arrays, said method being executed upon a highly parallel logic simulation machine (LSM) including a memory simulator which emulates a memory array with a plurality of memory ports, said memory simulator including input and output resources, said method comprising the steps of:

providing a set of array instructions through said LSM to said memory simulator, each array instruction of said set of array instructions defining a simulated memory access operation to be performed on said memory array;

binding each array instruction of said set of array instructions to a respective memory port of said plurality of memory ports;

storing said set of array instructions in said memory simulator;

partitioning said input resources into input resource subsets, each of said input resource subsets corresponding to a respective memory port of said plurality of memory ports;

permutatively entering first simulated memory access signals from said LSM into said input resource subsets according to a permutation pattern which corresponds each first simulated memory access signal with a respective memory port of said plurality of memory ports;

in said memory simulator, executing each array instruction of said set of array instructions, using first simulated memory access signals which are stored in an input resource subset corresponding with the respective memory port to which said array instruction is bound to represent parameters of the simulated memory access operation defined by said array instruction;

producing by execution of said array instructions second simulated memory access signals, said second simulated memory access signals representing the results of simulated memory access operations performed on said memory array; and permutatively providing through said output resources to said LSM said second simulated memory access signals.

2. The method of claim 1 wherein read and write instructions are included in said set of array instructions and said step of executing includes executing said read and write instructions in a predetermined order to simulate write-through of said memory array.

3. The method of claim 1 wherein said memory simulator incldues an addressable storage resource, said step of binding includes linking said respective memory port to an addresssable storage space in said addressable storage resource by providing a single base addresss in said access instruction which indentifies said addresssable storage space, and said step of producing includes producing second simulated memory access signals by execution of said array instruction and storage of said second simulated memory access signals in said addresssable storage space.

4. The method of claim 3 wherein said addressable storage resource has a data storage size (W), said memory array has a data storage size M, where M is greater than W, and:

said step of binding includes binding two or more array instructions of said set of array instructions to the safe respective memory port, each of said two or more array instructions defining the same simulated memory access operation, and linking said same respective memory port with a first addresssable storage space in a first of said two or more array instructions and with a second addressable storage space in a second of said two or more array instructions; and said step of producing includes producing S second simulated memory access signals, where S is greater than M and less than or equal to W, storing of W of said second simulated memory access signals in said first addresssable storage space, and storing S-W of said second simulated memory access signals in said second addressable storage space.

5. The method of claim 3 wherein each array instruction of said set of array instructions defines up to a maximum size N of simulate address space, said memory array has address space of size M and M is greater than N, and:

said step of binding includes binding two or more array instructions of said set of array instructions to the same memory port, each of said two or more array instructions defining the same simulated memory access operation, and linking said same memory port with a first addressable storage space equal in size to N in a first of said two or more array instructions, and linking said same memory port with a second addressable storage space having size M - N in a second of said two or more array instructions; and said step of producing includes producing S second simulated memory access signals, where S is greater than N and less than or equal to M, storing N of said second simulated memory access signals in said first addresssable storage space, and storing S-N of said second simualted memory access signals in said second addressable storage space.

6. In a highly parallel logic simulation machine (LSM) which produces access instructions, a permutation pattern, and input simulated memory access signals, a memory simulation processor for simulating multiport memory, said memory simultation processor comprising:

an input memory connected to said LSM for receiving groups of input simulated memory access signals, each of said groups defining parameters for a simulated memory access operation to be conducted at a simulated port of said multiport memory;

a programmable simulation profile memory means connected to said LSM for receiving and storing a set of array instructions, each array instruction of said set of array instructions defining a simulated port and a simualted memory access operation to be conducted at said simulated port;

programmable input permutation means connected to said LSM and to said input memory for permutatively entering each of said groups of input simulated memory access signals into a respective portion of said input memory according to said permutation pattern, said permutation pattern corresponding respective portions of said input memory with a simulated port defined by a respective array instruction of said set of array instructions;

instruction execution means connected to said programmable simulation profile memory means and to said input memory for obtaining an array instruction and a group of input simulated memory access signals in a respective portion of said input memory corresponding with the simulated port defined by said array instruction, said instruction execution means including means for executing said array instruction using said group of input simulated memory access signals to produce a group of output simulated memory access signals which indicate the result of the simulated memory access operation performed by said array instruction; and output means connected to said LSM and to said instruction execution means for obtaining groups of output simulated memory access signals and for permutatively providing said groups of output simulated memory access signals to said LSM as simulated output of said multiport memory.

7. The memory simulation processor of claim 6 wherein said simulated access operations correspond to read and write instructions included, in a predetermined order, in said array instructions to simulate write-through of said multiport memory when executed in said predetermined order by said means for executing.

8. The memory simulation processor of claim 6 further including an addresssable storage resource connected to said means for executing and to said output means, and wherein an array instruction of said set of array instructions includes a single base addresss linking a simulated port defined by said array instruction with an addressable portion of said addressable storage resource where a group of output memory access signals produced by execution of said array instruction is stored.

9. The memory simulation processor of claim 8, wherein said addresssable storage resource has a storage size W and said multiport memory has a data storage size M, where M is greater than W, said multiport memory being simulated by two or more array instructions, each array instruction of said two or more array instructions defining the same simulated port, but a first of said two or more array instructions linking said same simulating port with a first addressable portion of said addresssable storage resource and a second of said two or more array instructions linking said same simulated port with the second addressable portion of said addressable storage resource, said means for executing further for producing a group of S output simulated memory access signals, where S is greater than M and less than or equal to W, and storing W of said group of output simulated memory access signals in said first addresssable portion and S - M of said group of output simulated memory access signals in said second addresssable portion.

10. The memory simulation processor of claim 8, wherein each array instruction of said set of array instructions defines up to a maximum size N of simulated addresss space, said multiport memory has addresss space of size M and M is greater than N, said multiport memory being simulated by two or more array instructions, each array instruction of said two or more array instructions defining the same simulated port, but a first of said two or more array instructions linking said same simulated port with a first addressable portion of said addressable storage resource and second of said two or more array instructions linking said same simulated port with a second addressable portion of said addressable storage resource, said means for executing is further for producing a group of S output simulated memory access signals, where S is greater than N and less than or equal to M, and for storing N of said group of output simulated memory access signals in said first addressable portion and S - N of said group of output simulated memory access signals in said second addressable portion.

* * * * *